(12) United States Patent
Knapp et al.

(10) Patent No.: US 12,369,344 B2
(45) Date of Patent: Jul. 22, 2025

(54) QUANTUM DEVICES FORMED FROM A SINGLE SUPERCONDUCTING WIRE HAVING A CONFIGURABLE GROUND CONNECTION

(71) Applicant: Microsoft Technology Licensing, LLC, Redmond, WA (US)

(72) Inventors: Christina Paulsen Knapp, Goleta, CA (US); Roman Bela Bauer, Santa Barbara, CA (US); Torsten Karzig, Redwood City, CA (US); Jonne Verneri Koski, The Hague (NL); Roman Mykolayovych Lutchyn, Santa Barbara, CA (US); Dmitry Pikulin, Vancouver (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 397 days.

(21) Appl. No.: 17/871,045

(22) Filed: Jul. 22, 2022

(65) Prior Publication Data
US 2024/0030328 A1    Jan. 25, 2024

(51) Int. Cl.
*H10D 30/47*    (2025.01)
*H10N 60/10*    (2023.01)

(52) U.S. Cl.
CPC ......... *H10D 30/473* (2025.01); *H10N 60/128* (2023.02)

(58) Field of Classification Search
CPC .................................................... G06N 10/40
See application file for complete search history.

(56) References Cited

U.S. PATENT DOCUMENTS

| | | |
|---|---|---|
| 2018/0053113 A1 | 2/2018 | Lutchyn et al. |
| 2018/0053809 A1* | 2/2018 | Freedman ............. H10N 69/00 |
| 2019/0013457 A1 | 1/2019 | Lutchyn et al. |
| 2021/0005661 A1 | 1/2021 | Freedman et al. |

(Continued)

FOREIGN PATENT DOCUMENTS

WO    2023284936 A1    1/2023

OTHER PUBLICATIONS

Zhang et al. (Quantized Majorana Conductance. May 4, 2018. Nature vol. 556, p. 74) (Year: 2018).*

(Continued)

*Primary Examiner* — Raj R Gupta
(74) *Attorney, Agent, or Firm* — Ranjeev Singh; Singh Law, PLLC

(57) ABSTRACT

Quantum devices formed from a single superconducting wire having a configurable ground connection are described. An example quantum device, configurable to be grounded, comprises a single superconducting wire having at least a first section and a second section, each of which is configurable to be in a topological phase and at least a third section configurable to be in a trivial phase. The quantum device further comprises semiconducting regions formed adjacent to the single superconducting wire, where the single superconducting wire is configurable to store quantum information in at least four Majorana zero modes (MZMs). The semiconducting regions formed adjacent to the single superconducting wire may be used to measure quantum information stored in the at least four MZMs.

20 Claims, 17 Drawing Sheets

(56) References Cited

U.S. PATENT DOCUMENTS

| | | | |
|---|---|---|---|
| 2021/0011771 A1 | 1/2021 | Bonderson et al. | |
| 2021/0336119 A1 | 10/2021 | Utchyn et al. | |
| 2022/0036227 A1* | 2/2022 | Karzig | G06N 10/00 |

OTHER PUBLICATIONS

He et al. (Chiral Majorana fermion modes in a quantum anomalous Hall insulator-superconductor structure. Published 2017 Science 357, 294. Retracted 2021 374, 1454) (Year: 2021).*

Frolov (The Fallen Angel Particle. Nov. 17, 2022. Spin and Coffee.) (Year: 2022).*

Frolov (Quantum Computing's reproducibility crisis: Majorana Fermions. Apr. 15, 2021 Nature 592, 350) (Year: 2021).*

Choi (Major(ana) Backpedaling: Microsoft-Backed Quantum Computer Research Retracted. Mar. 17, 2021. IEEE Spectrum. spectrum. ieee.org/majorana-microsoft-backed-quantum-computer-research-retracted accessed on Dec. 14, 2024.) (Year: 2021).*

Ballard (Microsoft's revelatory quantum computing theory disproved by new evidence. Feb. 15, 2021. TechRadar. www.techradar. com/news/microsofts-revelatory-quantum-computing-theory-disproved-by-new-evidence accessed on Dec. 14, 2024.) (Year: 2021).*

Aghaee, et al., "InAs—Al Hybrid Devices Passing the Topological Gap Protocol", In Repository of arXiv:2207.02472v1, Jul. 6, 2022, pp. 1-34.

Deng, et al., "Nonlocality of Majorana Modes in Hybrid Nanowires", In Journal of Physics Review B, vol. 98, Issue 8, Aug. 13, 2018, pp. 1-10.

"International Search Report and Written Opinion Issued in PCT Application No. PCT/US2023/022010", Mailed Date: Aug. 31, 2023, 17 Pages.

"International Search Report and Written Opinion issued in PCT Application No. PCT/US2023/022016", Mailed Date: Sep. 20, 2023, 19 Pages.

Prada, et al., "Measuring Majorana Nonlocality and Spin Structure with a Quantum Dot", In Journal of Physical Review B, vol. 96, Issue 8, Aug. 11, 2017, pp. 1-10.

Sherman, et al., "Normal, Superconducting and Topological Regimes of Hybrid Double Quantum Dots", In Journal of Nature Nanotechnology, Nov. 14, 2016, pp. 212-217.

Zhou, et al., "Fusion of Majorana bound states with mini-gate control in two-dimensional systems", In Journal Nature Communications, vol. 13, Issue 1, Apr. 1, 2022, pp. 1-10.

Fidkowski, et al., "Majorana Zero Modes in 1D Quantum Wires Without Long-Ranged Superconducting Order", In Repository of arXiv:1106.2598v3, Jul. 6, 2011, 14 Pages.

Haim, et al., "Signatures of Majorana Zero Modes in Spin-Resolved Current Correlations", In Repository of arXiv:1411.0673v2, Apr. 28, 2015, 8 Pages.

Karzig, et al., "Scalable Designs for Quasiparticle-Poisoning-Protected Topological Quantum Computation with Majorana Zero Modes", In Repository of arXiv:1610.05289v4, Jun. 21, 2017, 34 Pages.

Knapp, et al., "Dephasing of Majorana-based Qubits", In Repository of arXiv:1711.03968v3, May 22, 2018, 15 Pages.

Petersson, et al., "Charge and Spin State Readout of a Double Quantum Dot Coupled to a Resonator", In Repository of arXiv:1004.4047v1, Apr. 23, 2010, 5 Pages.

Pikulin, et al., "Protocol To Identify A Topological Superconducting Phase In A Three-Terminal Device", In Repository of arXiv:2103.12217v1, Mar. 22, 2021, 28 Pages.

Plugge, et al., "Majorana Box Qubits", In Repository of arXiv:1609.01697v2, Dec. 21, 2016, 11 Pages.

Thakurathi, et al., "Transport Signatures of Topological Phases in Double Nanowires Probed by Spin-Polarized STM", In Repository of arXiv:2001.05470v1, Jan. 15, 2020, 12 Pages.

Tran, et al., "Optimizing Clifford Gate Generation for Measurement-Only Topological Quantum Computation with Majorana Zero Modes", In Repository of arXiv:1909.03002v4, Mar. 27, 2020, 72 Pages.

Zhang, et al., "Next Steps of Quantum Transport in Majorana Nanowire Devices", In Journal of Nature Communications, vol. 10, Article No. 5128, Nov. 12, 2019, 7 Pages.

Cao, et al., "Recent Progress on Majorana in Semiconductor-Superconductor Heterostructures-Engineering and Detection", In Repository of arXiv:2206.06916v1, Jun. 14, 2022, 19 Pages.

"International Search Report and Written Opinion Issued in PCT Application No. PCT/US2023/022011", Mailed Date: Jul. 27, 2023, 12 Pages.

U.S. Appl. No. 17/870,920, filed Jul. 22, 2022.
U.S. Appl. No. 17/870,969, filed Jul. 22, 2022.

* cited by examiner

1000

★ - MZM
▮ - CUTTER GATE
⬭ - QD
▢ - TRANSPORT LEAD

QUANTUM DEVICES FORMED FROM A SINGLE SUPERCONDUCTING WIRE HAVING A CONFIGURABLE GROUND CONNECTION

BACKGROUND

Measurement-based Majorana zero mode (MZM) qubits require the ability to tune portions of the device into the topological phase, in addition to the ability to perform qubit measurements. The transition into the topological phase for an MZM qubit is typically determined through a combination of local and non-local transport signatures. Previous MZM qubit designs have focused on the ability to perform measurements, and have not been compatible with the full range of transport signatures for tuning the topological phase. Accordingly, there is a need for improvements to MZM qubits.

SUMMARY

In one example, the present disclosure relates to a quantum device configurable to be grounded. The quantum device comprises a single superconducting wire having at least a first section and a second section, each of which is configurable to be in a topological phase and at least a third section configurable to be in a trivial phase. The quantum device may further comprise semiconducting regions formed adjacent to the single superconducting wire, where the single superconducting wire is configurable to store quantum information in at least four Majorana zero modes (MZMs). The semiconducting regions formed adjacent to the single superconducting wire may be used to measure quantum information stored in the at least four MZMs.

In another example, the present disclosure relates to a quantum device configurable to be grounded. The quantum device comprises a single superconducting wire having at least a first section configurable to be in a topological phase and at least a second section configurable to be in a trivial phase. The quantum device may further comprise semiconducting regions formed adjacent to the single superconducting wire, where the single superconducting wire is configurable to store classical information in at least two Majorana zero modes (MZMs). The semiconducting regions formed adjacent to the single superconducting wire may be used to measure quantum information stored in the at least two MZMs.

In yet another example, the present disclosure relates to a quantum device configurable to be grounded. The quantum device comprises a single superconducting wire having at least a first section and a second section, each of which is configurable to be in a topological phase and at least a third section configurable to be in a trivial phase. The quantum device may further comprise semiconducting regions formed adjacent to the single superconducting wire, where the single superconducting wire is configurable to store quantum information in at least four Majorana zero modes (MZMs). The semiconducting regions formed adjacent to the single superconducting wire may be used to measure quantum information stored in the at least four MZMs. The single superconducting wire may be patterned on a two-dimensional electron gas (2DEG), and the quantum device may further comprise a plurality of cutter gates and a plurality of quantum dot (QD) plunger gates.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
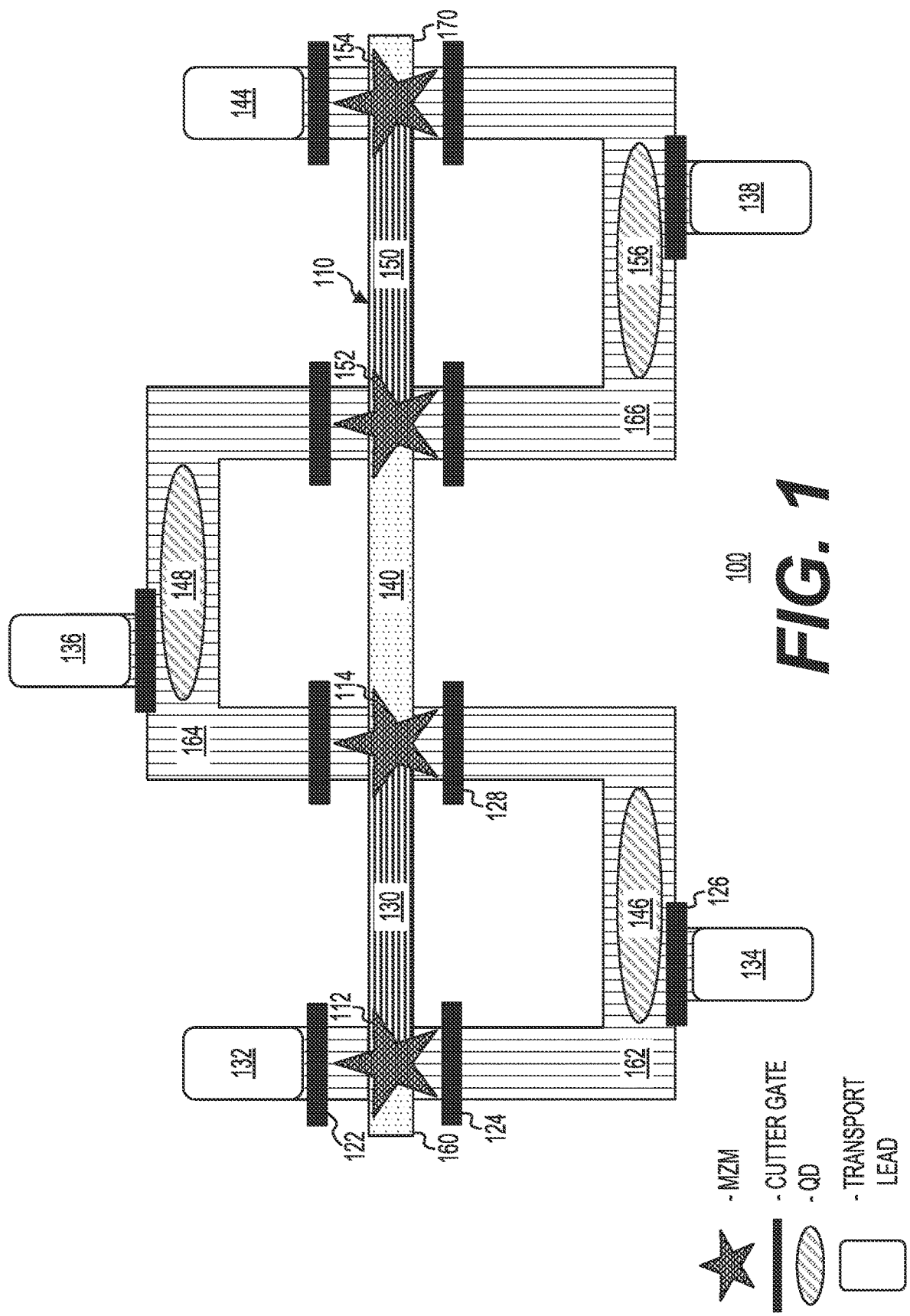
FIG. 1 shows a block diagram of a quantum device formed using a single superconducting wire in accordance with one example.

Examples described in this disclosure relate to quantum devices formed from a single superconducting wire having a configurable ground connection. Such quantum devices may also be referred to as linear Majorana-based devices. Majorana zero mode (MZM) qubits require rapidly configuring couplings between different pairs of MZMs for qubit operations and measurement. As used herein, the term qubit refers to any quantum system that can be in a superposition of two quantum states, 0 and 1. Consistent with the present disclosure, several examples of linear Majorana-based devices formed from a single superconducting wire patterned on two-dimensional electron gas (2DEGs) are described. Different segments of the wire can be tuned using electrostatic gates to form trivial or topological superconducting sections, with Majorana zero modes at their interface. These gates can also be used to control the density in the 2DEG to deplete certain sections and define semiconducting regions that can form quantum dots in Coulomb blockade, transport leads, and tunnel barriers. These different components can be used to define a linear Majorana parity readout device, or a linear Majorana-based qubit. These devices can be tuned using a combination of transport and radio frequency (RF) signatures. The devices can be operated by measuring pairs of MZMs by coupling them through quantum dots.

Certain examples described herein relate to linear Majorana-based qubits in a 2DEG that are configurable to be grounded. Each qubit may store information in either four or six Majorana zero modes (MZMs) and can be measured in any Pauli basis by coupling the associated pair of MZMs to adjacent quantum dots, which can then be read out using dispersive gate sensing. There are several benefits of the quantum devices described herein. First, building the qubit from a superconductor patterned on a 2DEG takes advantage of the high-quality 2DEG material, which is an essential component of realizing a topological phase and supporting the coherent single-electron transport required for MZM parity measurements. Second, building the qubit from a single superconducting wire simplifies fabrication. Third, grounding the superconducting island allows all topological wire segments to be tuned using the topological gap protocol. Fourth, the modular nature of the qubit allows one to test its different components (topological superconductor, trivial superconductor, quantum dots, junctions) before operating the full quantum device. Fifth, the quantum device can be operated by tuning quantum dots on/off resonance, reducing the required amplitude of voltage swings, and thereby simplifying qubit control as well as reducing heating associated with the qubit.

In addition, certain examples in the present disclosure relate to a linear Majorana parity device, which forms half of the linear qubit described above. The linear Majorana parity device has a single topological segment with two MZMs. As this device does not have degenerate ground states, it can be measured on longer time scales than the qubit, and can thus be used to test the qubit measurement before the design has been optimized for maximal signal to noise ratio (SNR). The linear Majorana parity devices described herein provide similar advantages as noted above for the linear Majorana-based qubits.

As used herein, the terms linear Majorana-based qubits and linear Majorana parity devices refer to those devices that can be formed by patterning a single superconducting wire on a 2DEG, and then using a magnetic field along the axis of the wire and electrostatic gates to tune the wire segments into either a trivial or a topological phase. The two ends of the superconductor wire can also be tuned using gates into trivial superconductor segments which are grounded. Electrostatic gates around the superconductor can be used to define an adjacent semiconducting region consisting of junctions, quantum dots, and transport leads, with all other parts of the 2DEG fully depleted. There may be three types of junctions in such devices: (1) junctions between the MZMs and neighboring semiconductors (QDs or transport leads), (2) junctions between QDs, and (3) junctions between QDs and transport leads. These regions can be defined through single layer gates by controlling the density of an uncovered region using side gates. Or through a combination of first and second layer gates, or even using additional gate layers, where first layer gates may define dimensions of the region and second layer gates may control density in the region.

All junctions for such devices may be tunable so that the qubit can be operated in different configurations. The topological segments and QDs can be tuned using transport signatures, and then disconnected from the transport leads when operating the qubit. The MZMs and QDs can be tunably coupled to define different measurement loops, corresponding to different parity measurements. The connection to ground can also be tuned. The superconducting wire can either have a direct Ohmic contact, or there can be a split in the superconductor wire between the Ohmic contact and the wire used to form the qubit. In the latter setup, a gate overlaps both sections of superconductor; when the gate is accumulating, the 2DEG below connects the two superconducting segments effectively grounding the MZM device. On the other hand, when the gate is depleting, the 2DEG below has no electron density and the two superconducting segments are cut from each other, effectively floating the MZM device. Floating the device reduces the probability of quasiparticle poisoning and allows for the possibility of performing two-qubit measurements.

FIG. 1 shows a block diagram of a quantum device 100 formed using a single superconducting wire in accordance with one example. Quantum device 100 may include a single superconducting wire 110, whose sections can be configured into the topological phase or the trivial phase. As an example, superconducting wire sections 130 and 150 may be configured into the topological phase. Superconducting wire sections 130 and 150 may be coupled via a superconducting wire section 140, which may be configured into the trivial phase. In one example, the terms topological and trivial refer to the phase of the superconductor sections that are tuned using electrostatic gates to form topological or trivial superconducting sections. The ends of superconducting wire sections 130 and 150 may further be coupled to superconducting wire sections 160 and 170, respectively, each of which may be configured into the trivial phase. Quantum device 100 may be built by patterning a superconducting wire on a 2DEG, and then using a magnetic field along the axis of the wire and electrostatic gates to tune the wire sections into either a trivial or a topological phase. Single superconducting wire 110 may be formed as a single nanowire. As an example, superconducting wire 110 may be formed as a superconductor wire (e.g., indium arsenide (InAs)) coated by a superconductor (e.g., aluminum (Al)). MZMs 112 and 114 may be coupled via semiconducting region 162, MZMs 114 and 152 may be coupled via semiconducting region 164, and MZMs 152 and 154 may be coupled via semiconducting region 166.

With continued reference to FIG. 1, quantum device 100 is operated such that Majorana zero modes (MZMs) 112 and 114 are formed at the ends of superconducting wire section 130 and MZMs 152 and 154 are formed at the ends of superconducting wire section 150. Electrostatic gates around the superconductor can be used to define an adjacent semiconducting region consisting of junctions, quantum dots, and transport leads, with all other parts of the 2DEG fully depleted. In this device, there are junctions between the MZMs and neighboring semiconductors (QDs or transport leads) and junctions between two semiconductors (QDs and transport leads). As an example, quantum device 100 includes several electrostatic gates, including cutter gates 122, 124, 126, and 128. Quantum device 100 further incudes several transport leads, including transport leads 132, 134, 136, 138, and 144. Quantum device 100 further includes several quantum dots that are configurable to be formed in the various semiconducting regions, including quantum dots 146, 148, and 156. Depending on the voltages applied to cutter gates 122 and 124, respectively, the semiconducting region adjacent to transport lead 132 and the semiconducting region adjacent to quantum dot 146 may be tuned. In a similar manner, the other junctions between the MZMs and neighboring semiconductors (QDs or transport leads) and the other junctions between two semiconductors (QDs and transport leads) can be tuned. Advantageously, building quantum device 100 from a superconductor patterned on a 2DEG takes advantage of the high-quality 2DEG material, which is an essential component of realizing a topological phase and supporting the coherent single-electron transport required for MZM parity measurements. Moreover, building quantum device 100 from a single superconducting wire simplifies fabrication. In addition, grounding the superconducting wire allows all topological wire segments to be tuned using the topological gap protocol. Furthermore, the modular nature of quantum device 100 allows one to test its different components (topological superconductor, trivial superconductor, quantum dots, junctions) before operating the full quantum device. Finally, quantum device 100 can be operated by tuning quantum dots on/off resonance.

Still referring to FIG. 1, MZMs supported by quantum device 100 of FIG. 1 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 100 can be grounded on each end (e.g., at the end of superconducting wire section 160 and at the end of superconducting wire section 170) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the MZM, one can supplement the topological gap protocol with transport measurements using spin filtering or particle-hole filtering for additional evidence of MZMs. Although FIG. 1 shows quantum device 100 as including a certain number of components arranged and coupled in a certain way, quantum device 100 may include fewer or additional components arranged and coupled differently.

The MZM junctions corresponding to quantum device 100 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)).

Figure 2:
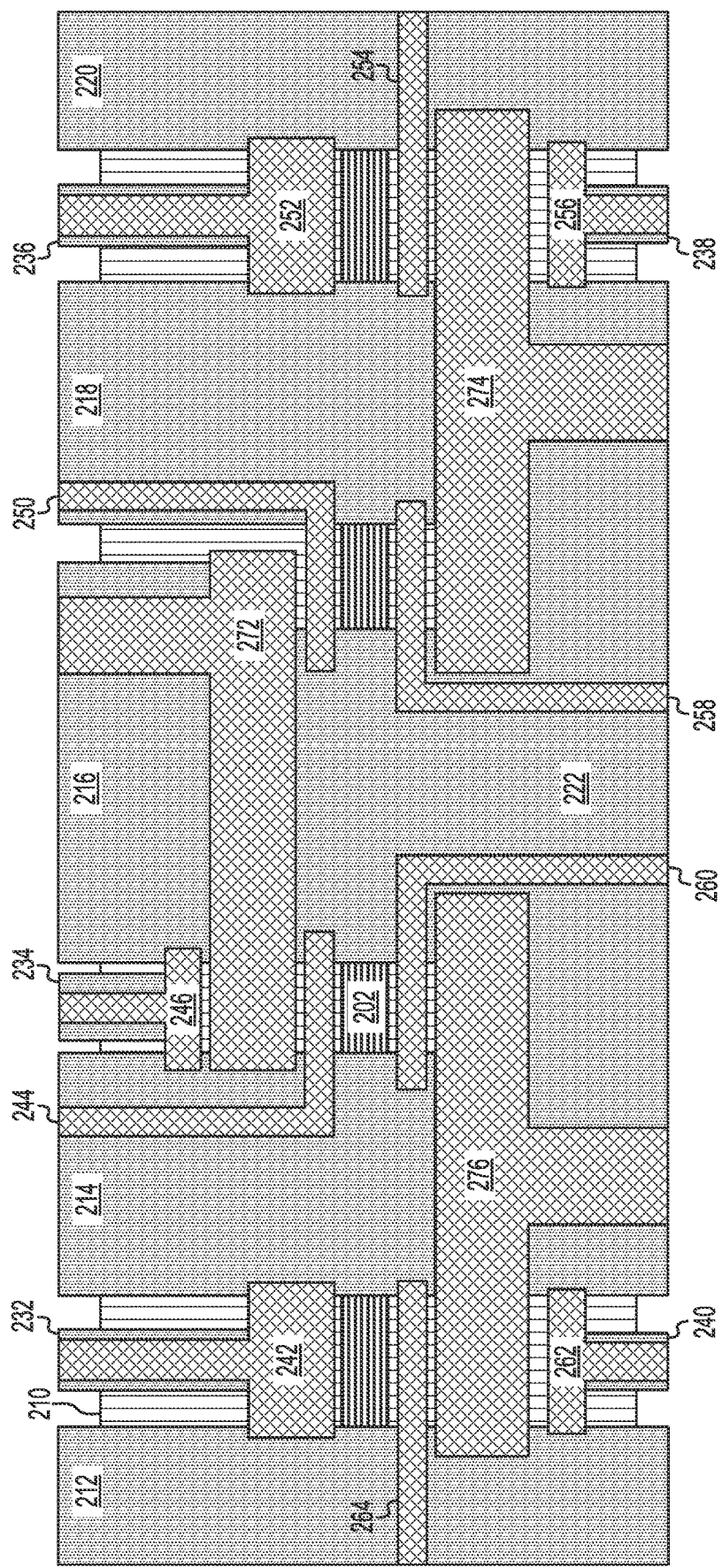
FIG. 2 shows a top view of an example dual layer gate configuration associated with the quantum device of FIG. 1.

FIG. 2 shows a top view 200 of an example dual layer gate configuration associated with quantum device 100 of FIG. 1. Single superconductor wire 202 corresponds to single superconducting wire 110, whose sections can be configured into the topological phase or the trivial phase. Single superconductor wire 202 is formed on 2DEG 210. Gates 212, 214, 216, 218, 220, and 222 may be configurable as depletion gates to remove electrons from selected areas of the underlying 2DEG. These gates may be formed in a first layer. In addition, transport leads, including transport lead 232 (corresponding to transport lead 132 of FIG. 1), transport lead 234 (corresponding to transport lead 136 of FIG. 1), transport lead 236 (corresponding to transport lead 144 of FIG. 1), transport lead 238 (corresponding to transport lead 138 of FIG. 1), and transport lead 240 (corresponding to transport lead 134 of FIG. 1) may also be formed in the first layer.

With continued reference to FIG. 2, additional gates, including cutter gates 242, 244, 246, 250, 252, 254, 256, 258, 260, 262, and 264 may also be formed in a second layer, different from the first layer. Quantum dot (QD) plunger gates 272, 274, and 276, which also may be formed in a second layer, different from the first layer, may be used to control the density of the underlying quantum dots. As used herein, the term QD plunger gate refers to "a gate that has a large overlap with the full extent of the QD." Applying appropriate voltages to these cutter gates and QD plunger gates allows one to tune the junctions between MZMs and neighboring semiconductors (QDs or transport leads) as well as the junctions between QDs and transport leads. As an example, QD plunger gate 276 (corresponding to quantum dot 146 of FIG. 1) may be used to control the density of a quantum dot. Although FIG. 2 shows a certain gate configuration corresponding to quantum device 100 of FIG. 1, other gate configurations may also be used to implement the functionality of quantum device 100 of FIG. 1. As an example, all gates may be implemented in a single layer.

Figure 3:
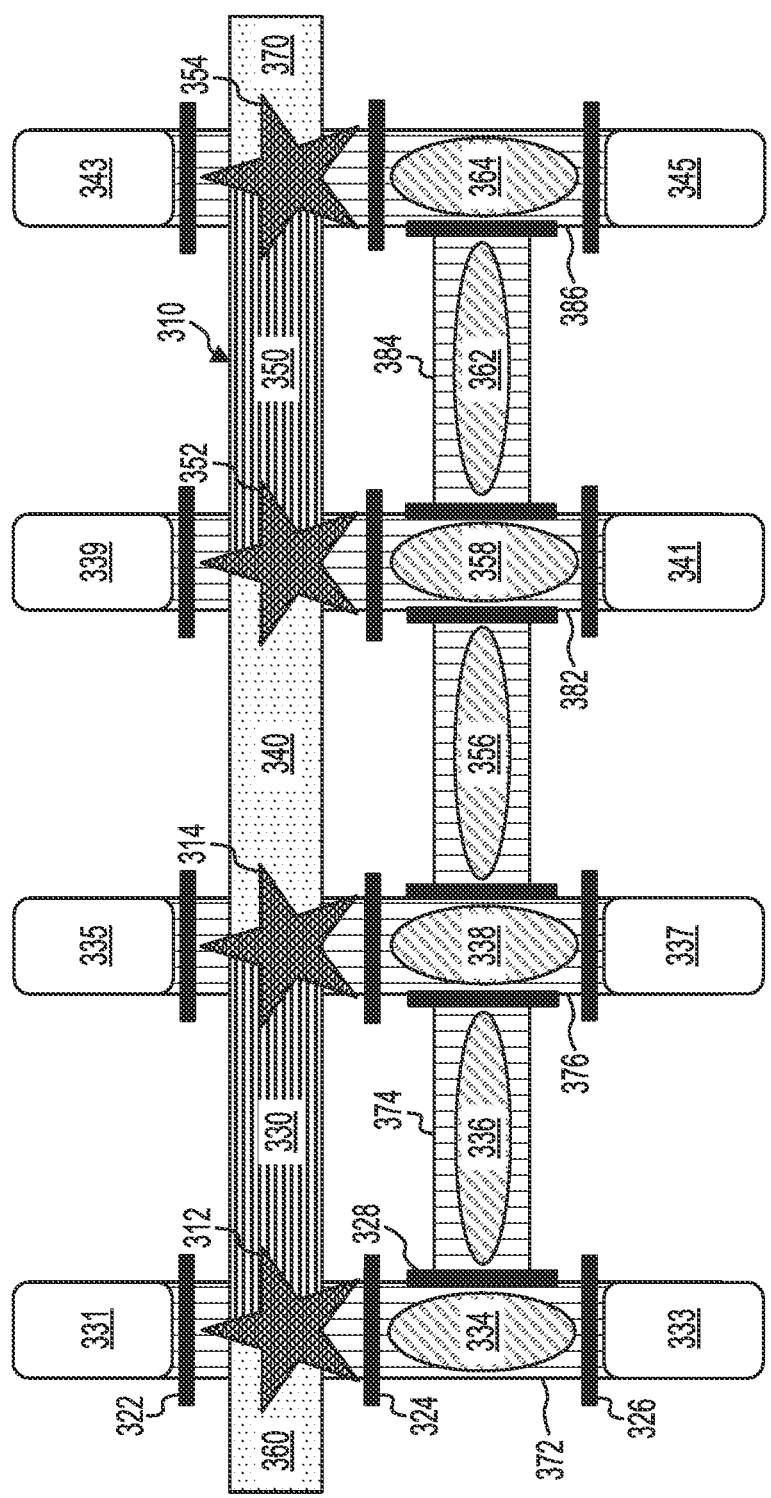
FIG. 3 shows a block diagram of another quantum device formed using a single superconducting wire in accordance with one example.

FIG. 3 shows a block diagram of another quantum device 300 formed using a single superconducting wire in accordance with one example. Quantum device 300 may include a single superconducting wire 310, whose sections can be configured into the topological phase or the trivial phase. As an example, superconducting wire sections 330 and 350 may be configured into a topological phase. Superconducting wire sections 330 and 350 may be coupled via a superconducting wire section 340, which may be configured into a trivial phase. In one example, as described earlier, the terms topological and trivial refer to the phase of the superconductor sections that are tuned using electrostatic gates to form topological or trivial superconducting sections. The ends of superconducting wire sections 330 and 350 may further be coupled to superconducting wire sections 360 and 370, respectively, each of which may be configured into a trivial phase. Quantum device 300 may be built by patterning a superconducting wire on a 2DEG, and then using a magnetic field along the axis of the wire and electrostatic gates to tune the wire sections into either a trivial or a topological phase. Single superconducting wire 310 may be formed as a single nanowire. As an example, superconducting wire 310 may be formed as a superconductor wire (e.g., indium arsenide (InAs)) coated by a superconductor (e.g., aluminum (Al)). Ends of superconducting wire section 330 may further be coupled via semiconducting regions 372, 374, and 376. Ends of superconducting wire section 350 may further be coupled via semiconducting regions 382, 384, and 386. In addition, ends of superconducting wire section 340 may also be coupled via semiconducting regions.

With continued reference to FIG. 3, quantum device 300 is operated such that Majorana zero modes (Mails) 312 and 314 are formed at the ends of superconducting wire section 330 and MZMs 352 and 354 are formed at the ends of superconducting wire section 350. Electrostatic gates around the superconductor can be used to define an adjacent semiconducting region consisting of junctions, quantum dots, and transport leads, with all other parts of the 2DEG fully depleted. There may be three types of junctions in this device, including: (1) junctions between the MZMs and neighboring semiconductors (QDs or transport leads), (2) junctions between QDs, and (3) junctions between QDs and transport leads. As an example, quantum device 300 includes several electrostatic gates, including cutter gates 322, 324, 326, and 328. Quantum device 300 further incudes several transport leads, including transport leads 331, 333, 335, 337, 339, 341, 343, and 345. Quantum device 300 further includes several quantum dots that are configurable to be formed in the various semiconducting regions, including quantum dots 334, 336, 338, 356, 358, 362, and 364. Depending on the voltages applied to cutter gates 322 and 324, respectively, the semiconducting region adjacent to transport lead 331 and the semiconducting region adjacent to quantum dot 334 may be tuned. In a similar manner, by application of appropriate voltages to the gates shown in FIG. 3, (1) junctions between the MZMs and neighboring semiconductors (QDs or transport leads), (2) junctions between QDs, and (3) junctions between QDs and transport leads can be tuned. Advantageously, building quantum device 300 from a superconductor patterned on a 2DEG takes advantage of the high-quality 2DEG material, which is an essential component of realizing a topological phase and supporting the coherent single-electron transport required for MZM parity measurements. Moreover, building quantum device 300 from a single superconducting wire simplifies fabrication. In addition, grounding the superconducting wire allows all topological wire segments to be tuned using the topological gap protocol. Furthermore, the modular nature of quantum device 300 allows one to test its different components (topological superconductor, trivial superconductor, quantum dots, junctions) before operating the full quantum device. Finally, quantum device 300 can be operated by tuning quantum dots on/off resonance.

Still referring to FIG. 3, similar to as described earlier with respect to quantum device 100 of FIG. 1, MZMs supported by quantum device 300 of FIG. 3 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 300 can be grounded on each end (e.g., at the end of superconducting wire section 360 and at the end of superconducting wire section 370) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the Mail, one can supplement the topological gap protocol with transport measurements using spin filtering or particle-hole filtering for additional evidence of MZMs. Although FIG. 3 shows quantum device 300 as including a certain number of components arranged and coupled in a certain way, quantum device 300 may include fewer or additional components arranged and coupled differently.

The MZM junctions corresponding to quantum device 300 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)).

Figure 4:
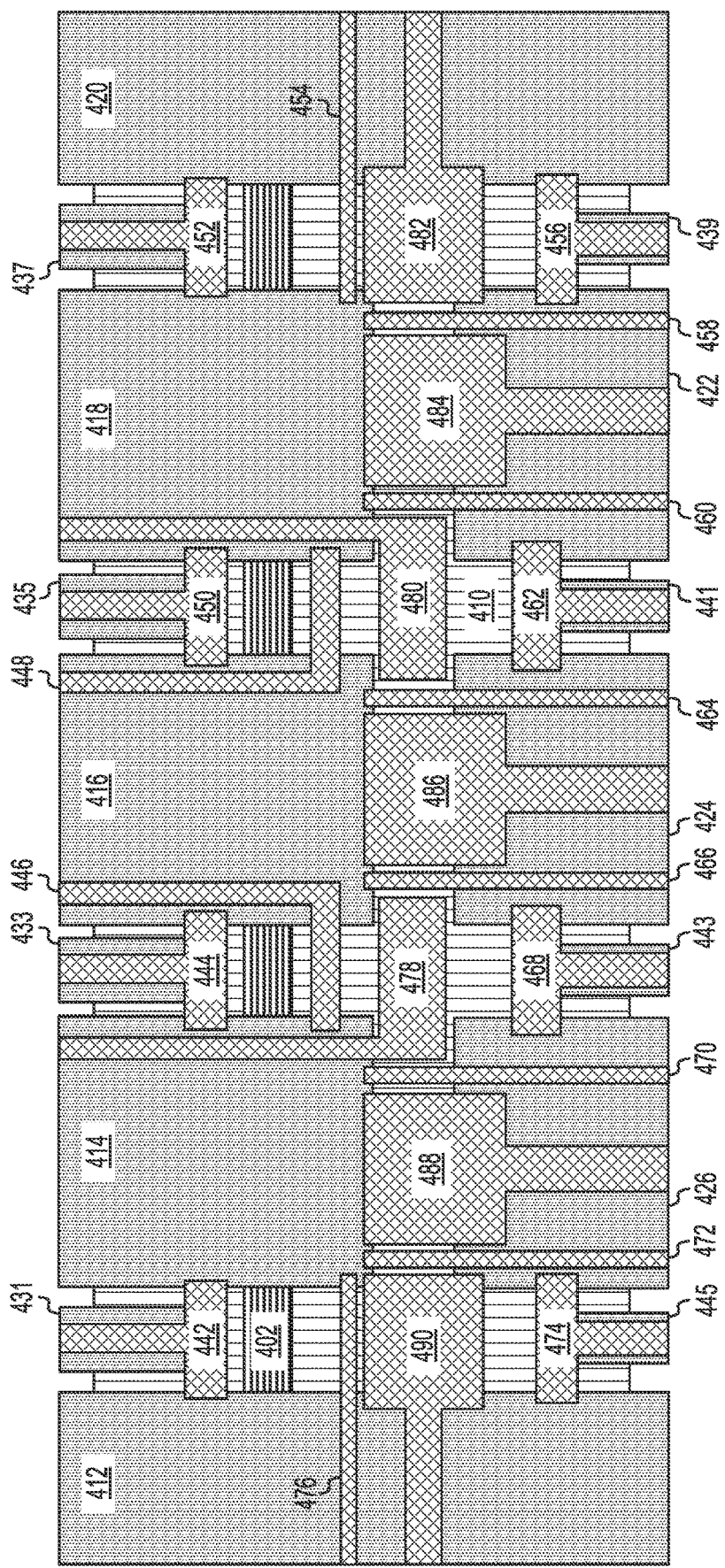
FIG. 4 shows a top view of an example dual layer gate configuration associated with the quantum device of FIG. 3.

FIG. 4 shows a top view 400 of an example dual layer gate configuration associated with quantum device 300 of FIG. 3. Single superconductor wire 402 corresponds to single superconducting wire 310, whose sections can be configured into the topological phase or the trivial phase. Single superconductor wire 402 is formed on 2DEG 410. Gates 412, 414, 416, 418, 420, 422, 424, and 426 may be configurable as depletion gates to remove electrons from selected areas of the underlying 2DEG. These gates may be formed in a first layer. In addition, transport leads, including transport lead 431 (corresponding to transport lead 331 of FIG. 3), transport lead 433 (corresponding to transport lead 335 of FIG. 3), transport lead 435 (corresponding to transport lead 339 of FIG. 3), transport lead 437 (corresponding to transport lead 343 of FIG. 3), transport lead 439 (corresponding to transport lead 345 of FIG. 3), transport lead 441 (corresponding to transport lead 341 of FIG. 3), transport lead 443 (corresponding to transport lead 337 of FIG. 3), and transport lead 445 (corresponding to transport lead 333 of FIG. 3) may also be formed in the first layer associated.

With continued reference to FIG. 4, additional gates, including cutter gates 442, 444, 446, 448, 450, 452, 454, 456, 458, 460, 462, 464, 466, 468, 470, 472, 474, and 476 may also be formed in a second layer, different from the first layer. QD plunger gates 478, 480, 482, 484, 486, 488, and 490 may also be formed in a second layer, different from the first layer, and may be used to control the density of the adjacent quantum dots. As explained earlier, by an application of the appropriate voltages to these cutter gates and QD plunger gates, the junctions, including: (1) junctions between the MZMs and neighboring semiconductors (QDs or transport leads), (2) junctions between QDs, and (3) junctions between QDs and transport leads can be tuned. As an example, QD plunger gate 488 may be used to control the density of a quantum dot (e.g., quantum dot 336 of FIG. 3). Although FIG. 4 shows a certain gate configuration corresponding to quantum device 300 of FIG. 3, other gate configurations may also be used to implement the functionality of quantum device 300 of FIG. 3. As an example, all gates may be implemented in a single layer.

Figure 5:
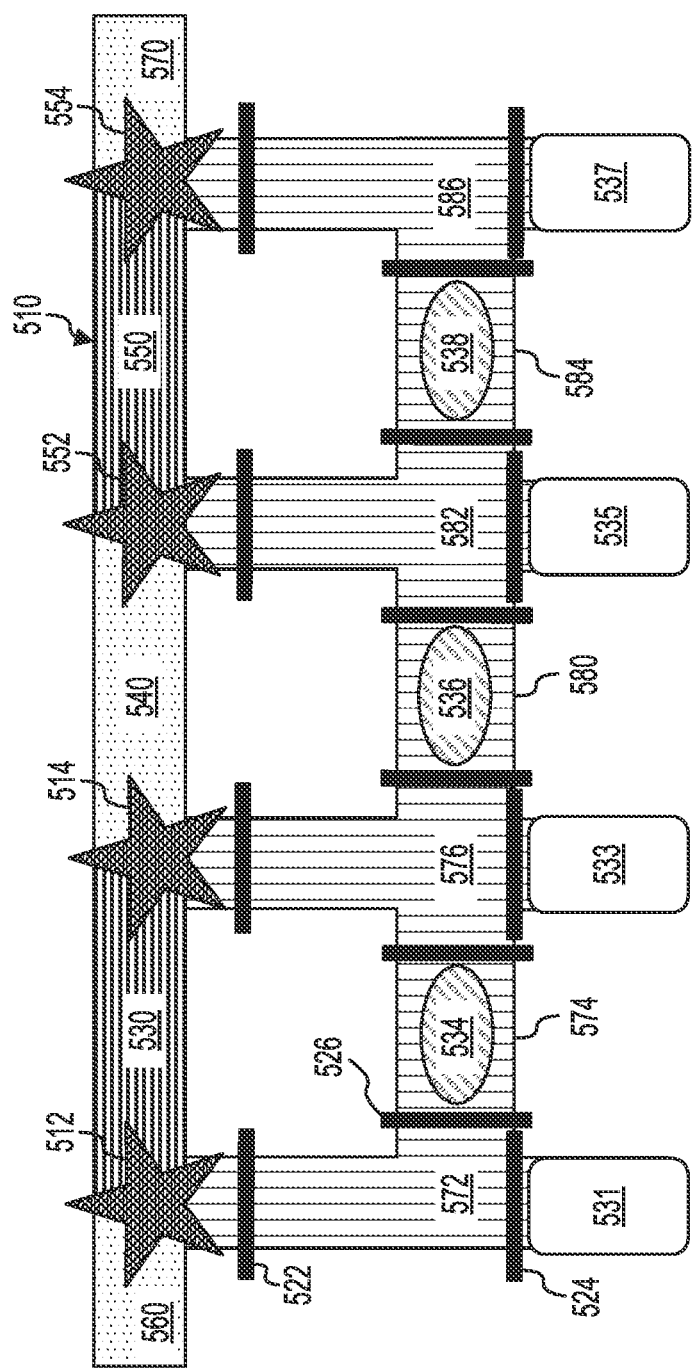
FIG. 5 shows a block diagram of another quantum device formed using a single superconducting wire in accordance with one example.
Figure 5:

FIG. 5 shows a block diagram of another quantum device 500 formed using a single superconducting wire in accordance with one example. Quantum device 500 may include a single superconducting wire 510, whose sections can be configured into a topological phase or a trivial phase. As an example, superconducting wire sections 530 and 550 may be configured into a topological phase. Superconducting wire sections 530 and 550 may be coupled via a superconducting wire section 540, which may be configured into a trivial phase. In one example, as described earlier, the terms topological and trivial refer to the phase of the superconductor sections that are tuned using electrostatic gates to form topological or trivial superconducting sections. The ends of superconducting wire sections 530 and 550 may further be coupled to superconducting wire sections 560 and 570, respectively, each of which may be configured into the trivial phase. Quantum device 500 may be bunt by patterning a superconducting wire on a 2DEG, and then using a magnetic field along the axis of the wire and electrostatic gates to tune the wire sections into either a trivial or a topological phase. Single superconducting wire 510 may be formed as a single nanowire. As an example, superconducting wire 510 may be formed as a superconductor wire (e.g., indium arsenide (InAs)) coated by a superconductor (e.g., aluminum (Al)). Ends of superconducting wire section 530 may further be coupled via semiconducting regions 572, 574, and 576. Ends of superconducting wire section 550 may further be coupled via semiconducting regions 582, 584, and 586. Ends of superconducting wire section 540 may further be coupled via semiconducting regions 576, 580, and 582.

With continued reference to FIG. 5, quantum device 500 is operated such that Majorana zero modes (MZMs) 512 and 514 are formed at the ends of superconducting wire section 530 and MZMs 552 and 554 are formed at the ends of superconducting wire section 550. Electrostatic gates around the superconductor can be used to define an adjacent semiconducting region consisting of junctions, quantum dots, and transport leads, with all other parts of the 2DEG fully depleted. As described earlier, there may be three types of notions in such devices: (1) junctions between the MZMs and neighboring semiconductors (QDs or transport leads), (2) junctions between QDs, and (3) junctions between QDs and transport leads. As an example, quantum device 500 includes several electrostatic gates, including cutter gates 522, 524, and 526. Quantum device 500 further incudes several transport leads, including transport leads 531, 533, 535, and 537. Quantum device 500 further includes several quantum dots that are configurable to be formed in the various semiconducting regions, including quantum dots 534, 536, and 538. Depending on the voltages applied to cutter gates 522 and 524, respectively, the semiconducting region adjacent to transport lead 531 may be tuned. In a similar manner, an application of appropriate voltages to the gates shown in FIG. 5, (1) junctions between the MZMs and neighboring semiconductors (QDs or transport leads), (2) junctions between QDs, and (3) junctions between QDs and transport leads can be tuned. Advantageously, building quantum device 500 from a superconductor patterned on a 2DEG takes advantage of the high-quality 2DEG material, which is an essential component of realizing a topological phase and supporting the coherent single-electron transport required for MZM parity measurements. Moreover, building quantum device 500 from a single superconducting wire simplifies fabrication. In addition, grounding the superconducting wire allows all topological wire segments to be tuned using the topological gap protocol. Furthermore, the modular nature of quantum device 500 allows one to test its different components (topological superconductor, trivial superconductor, quantum dots, junctions) before operating the full quantum device. Finally, quantum device 500 can be operated by tuning quantum dots on/off resonance.

Still referring to FIG. 5, similar to as described earlier with respect to quantum device 100 of FIG. 1, MZMs supported by quantum device 500 of FIG. 5 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 300 can be grounded on each end (e.g., at the end of superconducting wire section 560 and at the end of superconducting wire section 570) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the MZM, one can supplement the topological gap protocol with transport measurements using spin filtering or particle-hole filtering for additional evidence of MZMs. Although FIG. 5 shows quantum device 500 as including a certain number of components arranged and coupled in a certain way, quantum device 500 may include fewer or additional components arranged and coupled differently.

Figure 6:
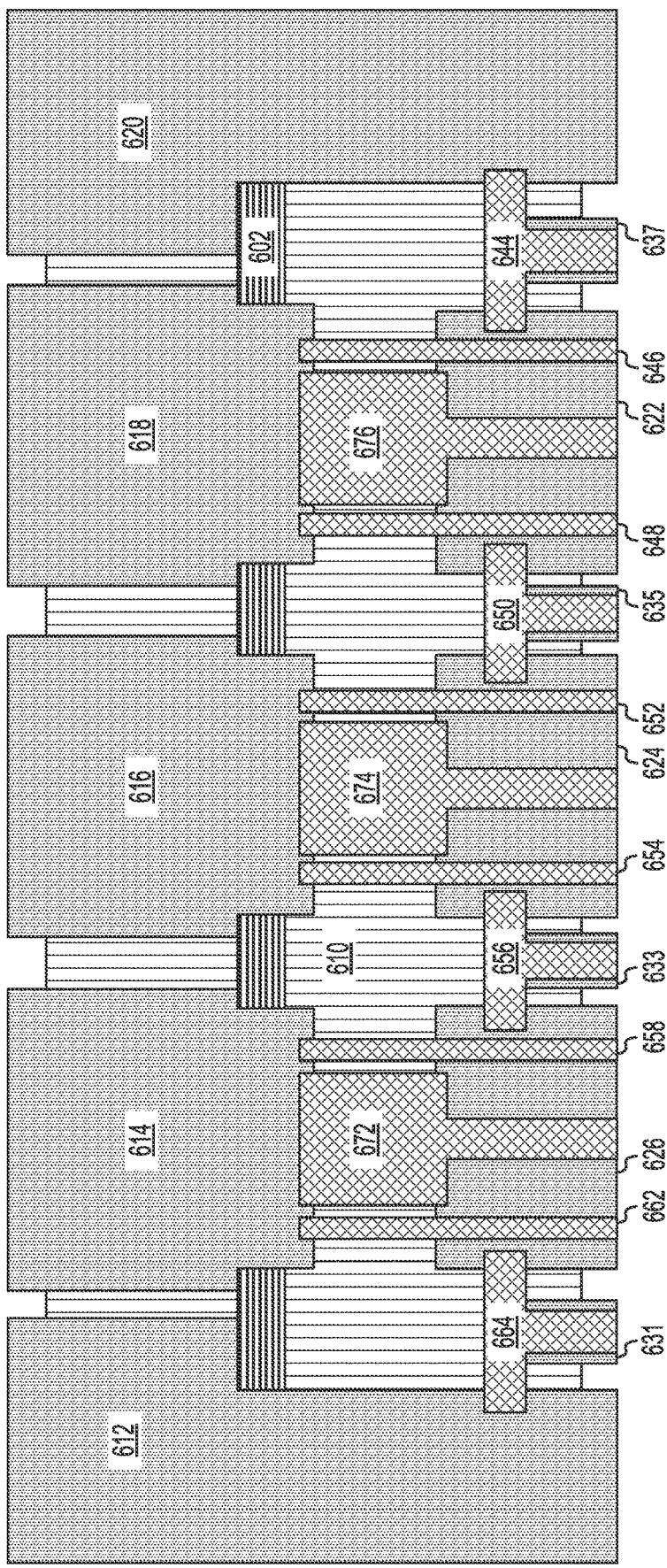
FIG. 6 shows a top view of an example dual layer gate configuration associated with the quantum device of FIG. 5.
Figure 7:
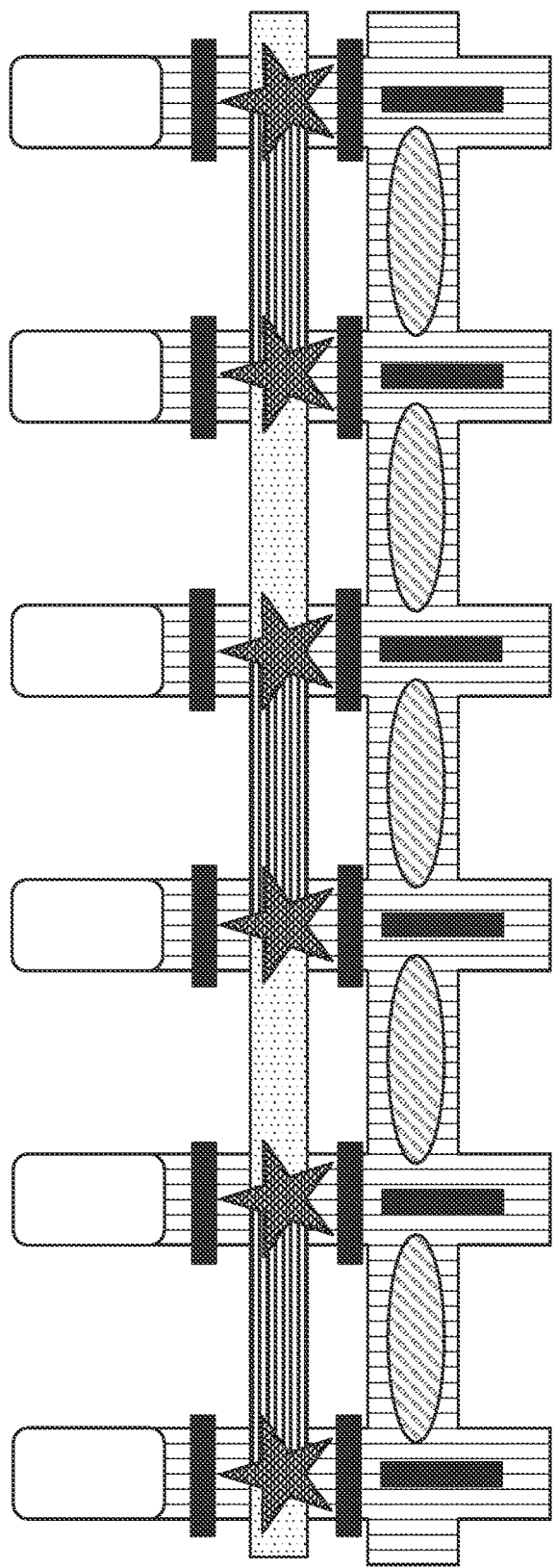
FIGS. 7-10 show additional block diagrams of example quantum devices formed using a single superconducting wire.
Figure 7:
Figure 8:
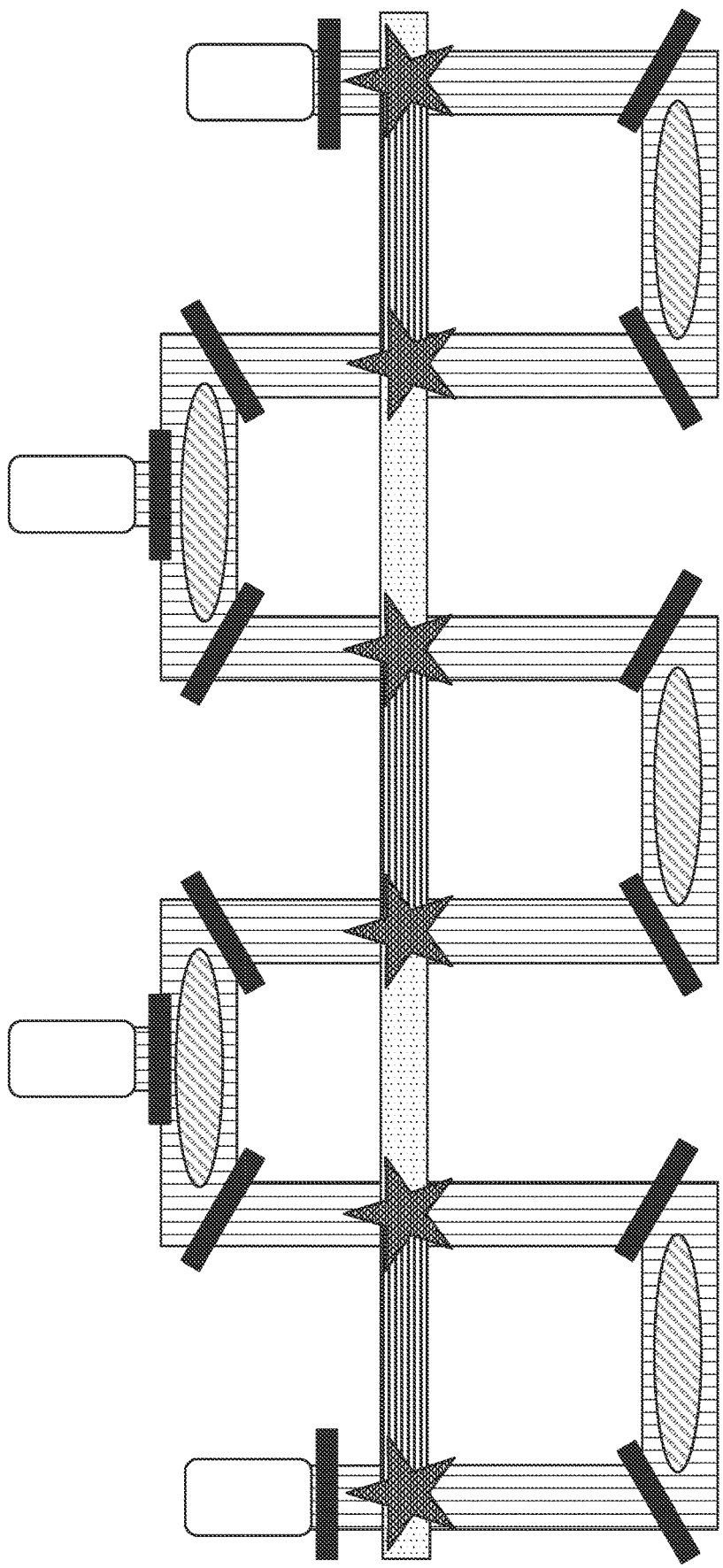
Figure 9:
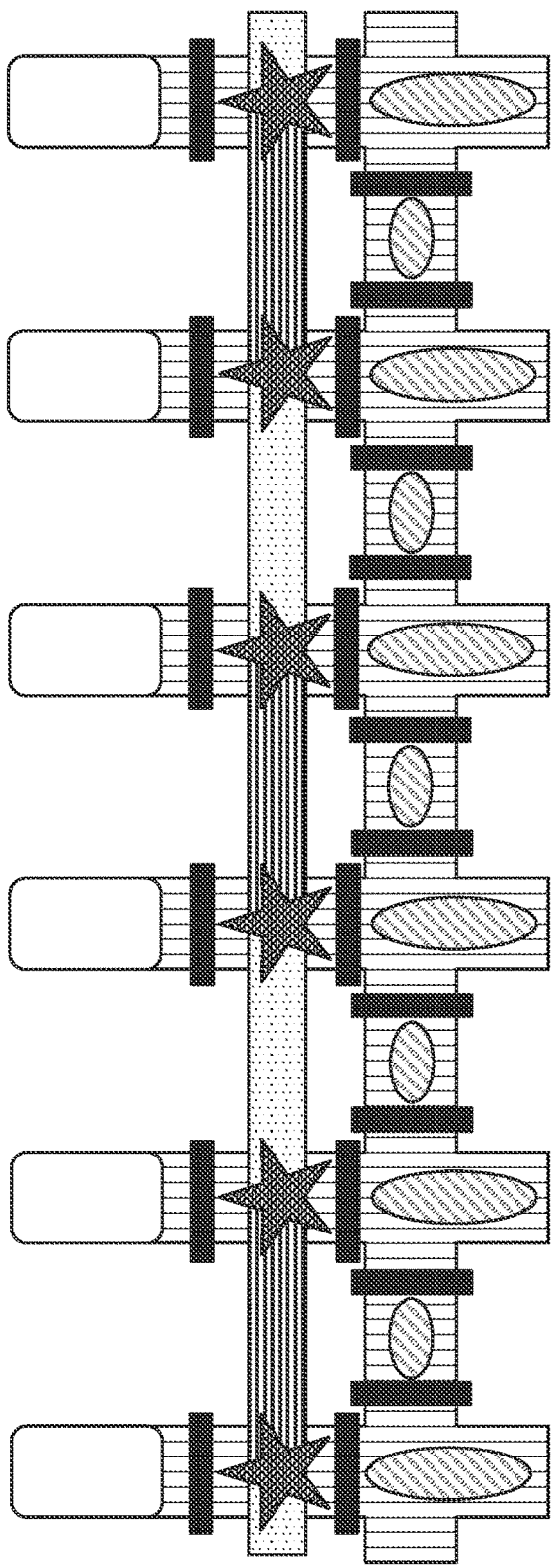
Figure 10:
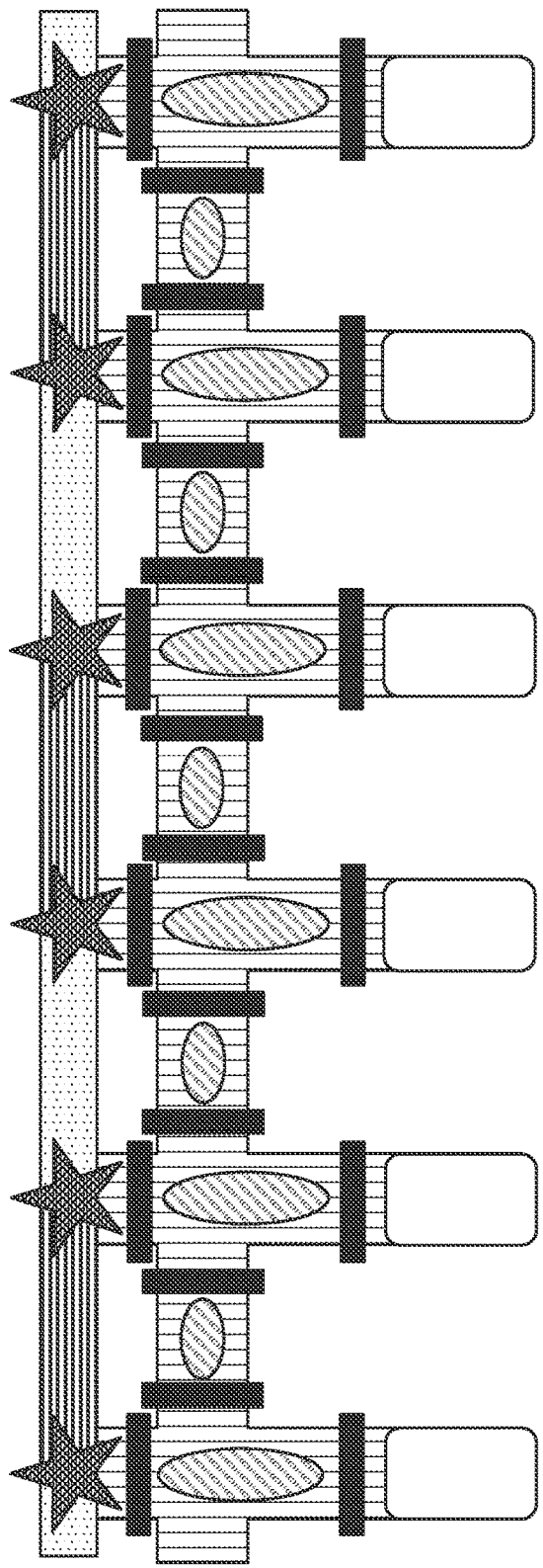

The MZM junctions corresponding to quantum device 500 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InF) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)), FIG. 6 shows a top view 600 of an example dual layer gate configuration associated with quantum device 500 of FIG. 5. Single superconductor wire 602 corresponds to single superconducting wire 510, whose sections can be configured into the topological phase or the trivial phase. Single superconductor wire 602 is formed on 2DEG 610. Gates 612, 616, and 620 may be configurable as both depletion gates and as trivial superconductor plunger gates. Gates 614 and 618 may be configurable as both depletion gates and topological superconductor plunger gates. Gates 622, 624, and 626 may be configurable as depletion gates to remove electrons from selected areas of the underlying 2DEG. These gates may be formed in a first layer associated with quantum device 500 of FIG. 5. In addition, transport leads, including transport lead 631 (corresponding to transport lead 531 of FIG. 5), transport lead 633 (corresponding to transport lead 533 of FIG. 5), transport lead 635 (corresponding to transport lead 535 of FIG. 5), and transport lead 637 (corresponding to transport lead 537 of FIG. 5) may also be formed in the first layer associated with quantum device 500 of FIG. 5.

With continued reference to FIG. 6, additional gates, including cutter gates 644, 646, 648, 650, 652, 654, 656, 658, 662, and 664 may also be formed in a second layer, different from the first layer. QD plunger gates 672, 674, and 676, which may also be formed in a second layer, different from the first layer, may be used to control the density of the adjacent quantum dots. As explained earlier, by an application of appropriate voltages to these cutter gates and QD plunger gates, the junctions, including: (1) junctions between the MZMs and neighboring semiconductors (QDs or transport leads), (2) junctions between ODs, and (3) junctions between ODs and transport leads can be tuned. As an example, QD plunger gate 672 may be used to control the density of a quantum dot (e.g., quantum dot 534 of FIG. 5). Although FIG. 6 shows a certain gate configuration corresponding to quantum device 500 of FIG. 5, other gate configurations may also be used to implement the functionality of quantum device 500 of FIG. 5. As an example, all gates may be implemented in a single layer.

FIGS. 7-10 show additional block diagrams of example quantum devices (e.g., quantum device 700 of FIG. 7, quantum device 800 of FIG. 8, quantum device 900 of FIG. 9, and quantum device 1000 of FIG. 10) that can be formed and operated in a similar manner as described with respect to quantum devices 100, 300, and 500 described earlier. In addition, similar example gate configurations as described earlier with respect to FIGS. 2, 4, and 6 may be utilized.

Figure 11:
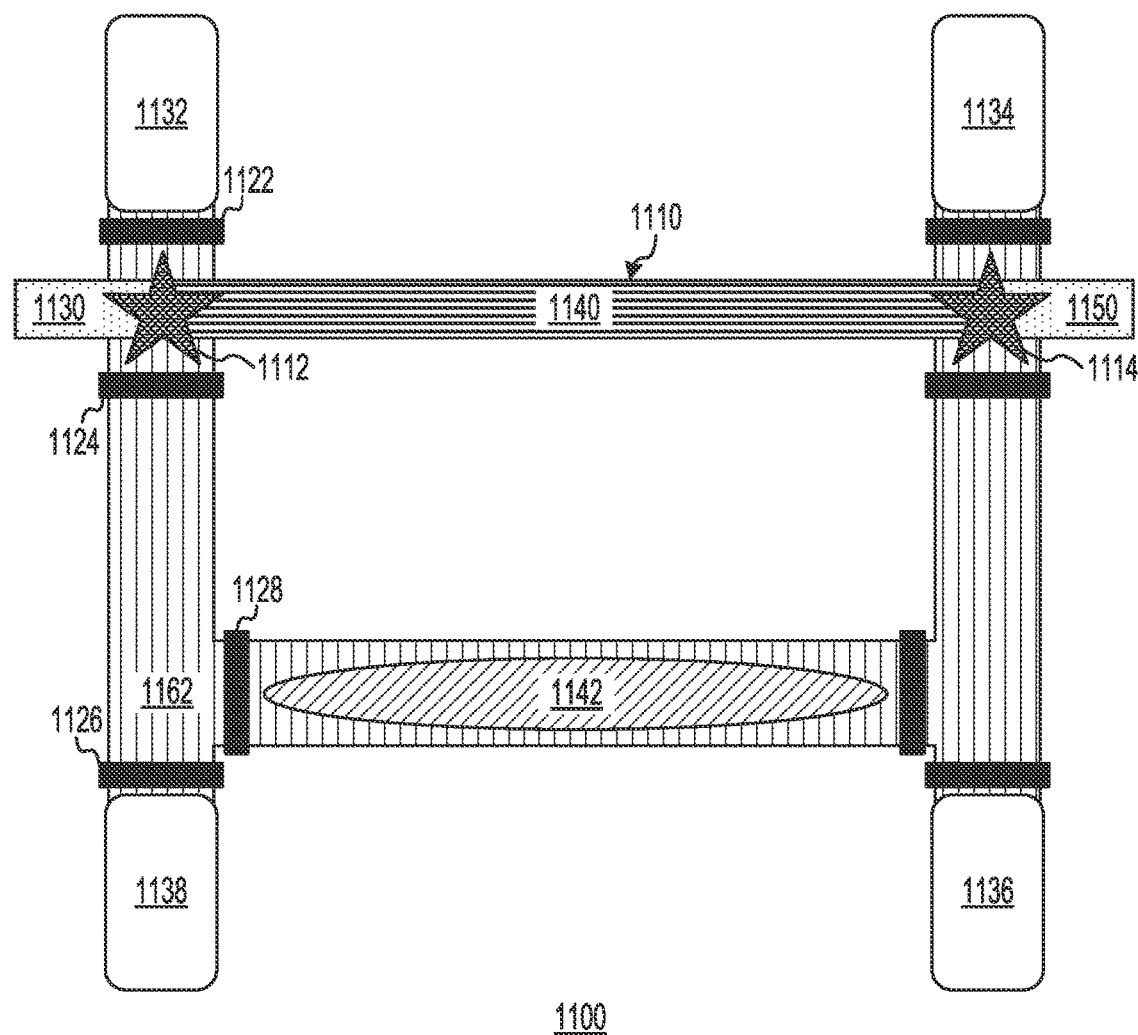
FIG. 11 shows a block diagram of a quantum device formed using a single superconducting wire in accordance with one example.
Figure 11:
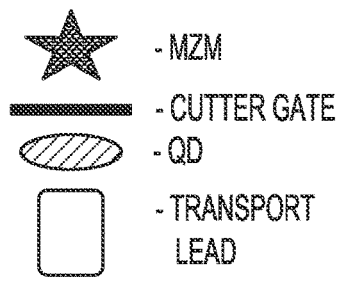

FIG. 11 shows a block diagram of a quantum device 1100 formed using a single superconducting wire in accordance with one example. Quantum device 1100 is an example linear Majorana parity device, whose topological sections can be tuned with the topological gap protocol. Each of the quantum devices described with respect to FIGS. 11-16 may be configurable to store a classical bit of information (e.g., 0 or 1) in two Majorana zero modes (MZMs). Quantum device 1100 may include a single superconducting wire 1110, whose sections can be configured into the topological phase or the trivial phase. As an example, superconducting wire sections 1130 and 1150 may be configured into a trivial phase. Superconducting wire section 1140 may be configured into a topological phase with MZMs 1112 and 1114 at either end. In one example, the terms topological and trivial refer to the phase of the superconductor sections that are tuned using electrostatic gates to form topological or trivial superconducting sections. Quantum device 1100 may be built by patterning a superconducting wire on a 2DEG, and then using a magnetic field along the axis of the wire and electrostatic gates to tune the wire sections into either a trivial or a topological phase. Single superconducting wire 1110 may be formed as a single nanowire. As an example, superconducting wire 1110 may be formed as a superconductor wire (e.g., indium arsenide (InAs)) coated by a superconductor (e.g., aluminum (Al)). Ends of superconducting wire section 1140 may further be coupled via semiconducting region 1162.

With continued reference to FIG. 11, quantum device 1100 is operated such that Majorana zero modes (MZMs) 1112 and 1114 are formed at the ends of superconducting wire section 1140. Electrostatic gates around the superconductor can be used to define an adjacent semiconducting region consisting of junctions, quantum dots, and transport leads, with all other parts of the 2DEG fully depleted. In this device, there are junctions between the MZMs and neighboring semiconductors (QDs or transport leads) and junctions between two semiconductors (QDs and transport leads). As an example, quantum device 1100 includes several electrostatic gates, including cutter gates 1122, 1124, and 1126. Quantum device 1100 further incudes several transport leads, including transport leads 1132, 1134, 1136, and 1168. Quantum device 1100 further includes a quantum dot 1142. Depending on the voltages applied to cutter gate 1122, the semiconducting region adjacent to transport lead 1132 may be tuned. In addition, cutter gate 1128 may be used to control the coupling of the region adjacent to quantum dot 1142. In a similar manner, the other junctions between the Mails and neighboring semiconductors (QDs or transport leads) and notions between two semiconductors (QDs and transport leads) can be tuned. Advantageously, building quantum device 1100 from a superconductor patterned on a 2DEG takes advantage of the high-quality 2DEG material, which is an essential component of realizing a topological phase and supporting the coherent single-electron transport required for MZM parity measurements. Moreover, building quantum device 1100 from a single superconducting wire simplifies fabrication. In addition, grounding the superconducting wire allows all topological wire segments to be tuned using the topological gap protocol. Furthermore, the modular nature of quantum device 1100 allows one to test its different components (topological superconductor, trivial superconductor, quantum dots, junctions) before operating the full quantum device. Finally, quantum device 1100 can be operated by tuning quantum dots on/off resonance.

Still referring to FIG. 11, MZMs supported by quantum device 1100 of FIG. 11 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 1100 can be grounded on each end (e.g., at the end of superconducting wire section 1130 and at the end of superconducting wire section 1150) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the MZM, one can supplement the topological gap protocol with transport measurements using spin filtering or particle-hole filtering for additional evidence of MZMs. Although FIG. 11 shows quantum device 1100 as including a certain number of components arranged and coupled in a certain way, quantum device 1100 may include fewer or additional components arranged and coupled differently.

The MZM junctions corresponding to quantum device 1100 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups H, III IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)).

Figure 12:
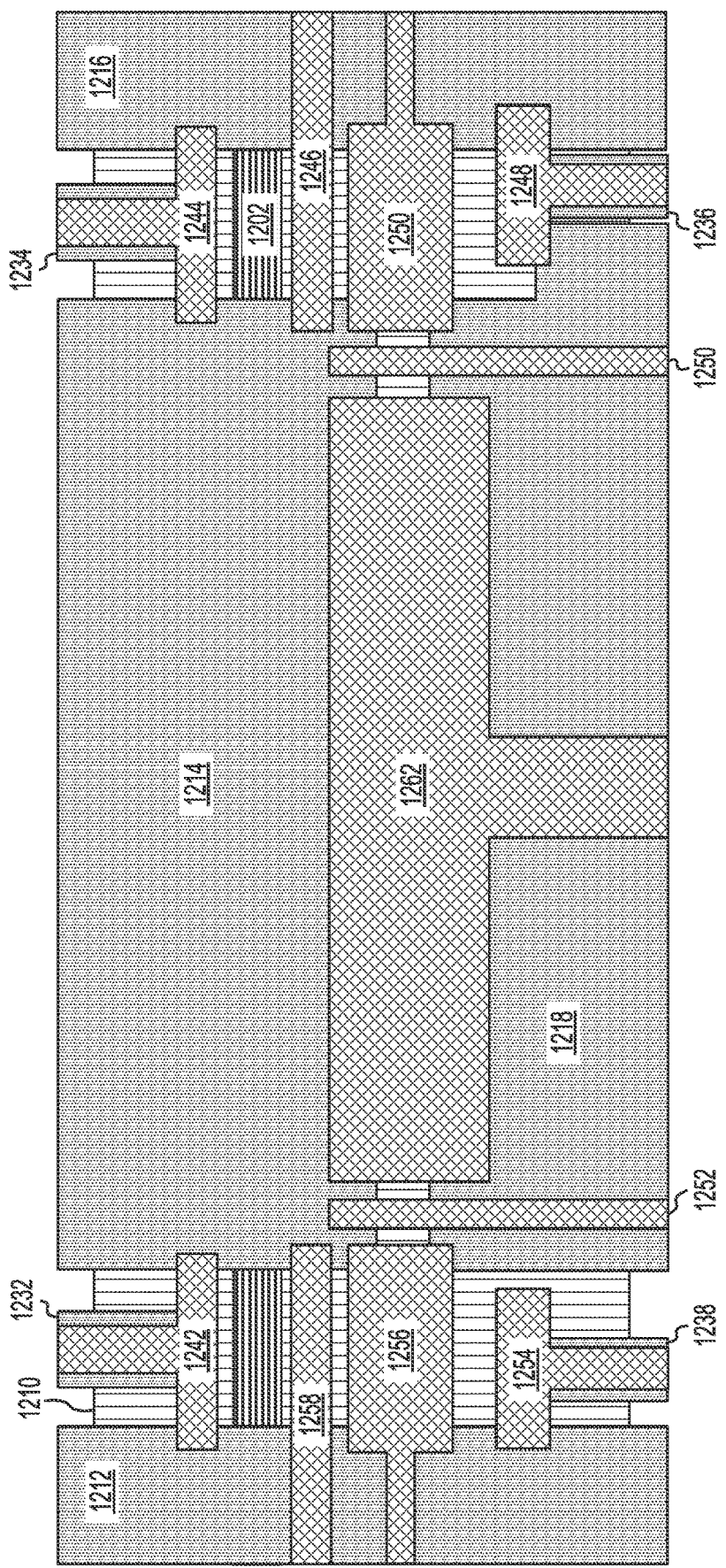
FIG. 12 shows a top view of an example dual layer gate configuration associated with the quantum device of FIG. 11.

FIG. 12 shows a top view 1200 of an example dual layer gate configuration associated with quantum device 1100 of FIG. 11. Single superconductor ire 1202 corresponds to single superconducting wire 1110, whose sections can be configured into the topological phase or the trivial phase. Single superconductor wire 1202 is formed on 2DEG 1210. Gates 1212 and 1216 may be configurable as both depletion gates and trivial superconductor plunger gates. Gate 1214 may be configurable as both a depletion gate and a topological superconductor plunger gate. Gate 1218 may be configurable as a depletion gate. These gates may be formed in a first layer associated with quantum device 1100 of FIG. 11. In addition, transport leads, including transport leads 1232 (corresponding to transport lead 1132 of FIG. 11), 1234 (corresponding to transport lead 1134 of FIG. 11), 1236 (corresponding to transport lead 1136 of FIG. 11), and 1238 (corresponding to transport lead 1138 of FIG. 11) may also be formed in the first layer associated with quantum device 1100 of FIG. 11.

With continued reference to FIG. 12, additional gates, including cutter gates 1242, 1244, 1246, 1248, 1252, 1254, and 1258 may also be formed in a second layer, different from the first layer. QD plunger gates 1250, 1256, and 1262 may also be formed in the second layer, different from the first layer. Applying appropriate voltages to these cutter gates and QD plunger gates allows one to tune the junctions between MZMs and neighboring semiconductors (QDs or transport leads) as well as the junctions between QDs and transport leads. As an example, QD plunger gate 1262 may be used to control the density of a quantum dot (e.g., quantum dot 1142 of FIG. 11). Although FIG. 12 shows a certain gate configuration corresponding to quantum device 1100 of FIG. 11, other gate configurations may also be used to implement the functionality of quantum device 1100 of FIG. 11. As an example, all gates may be implemented in a single layer.

Figure 13:
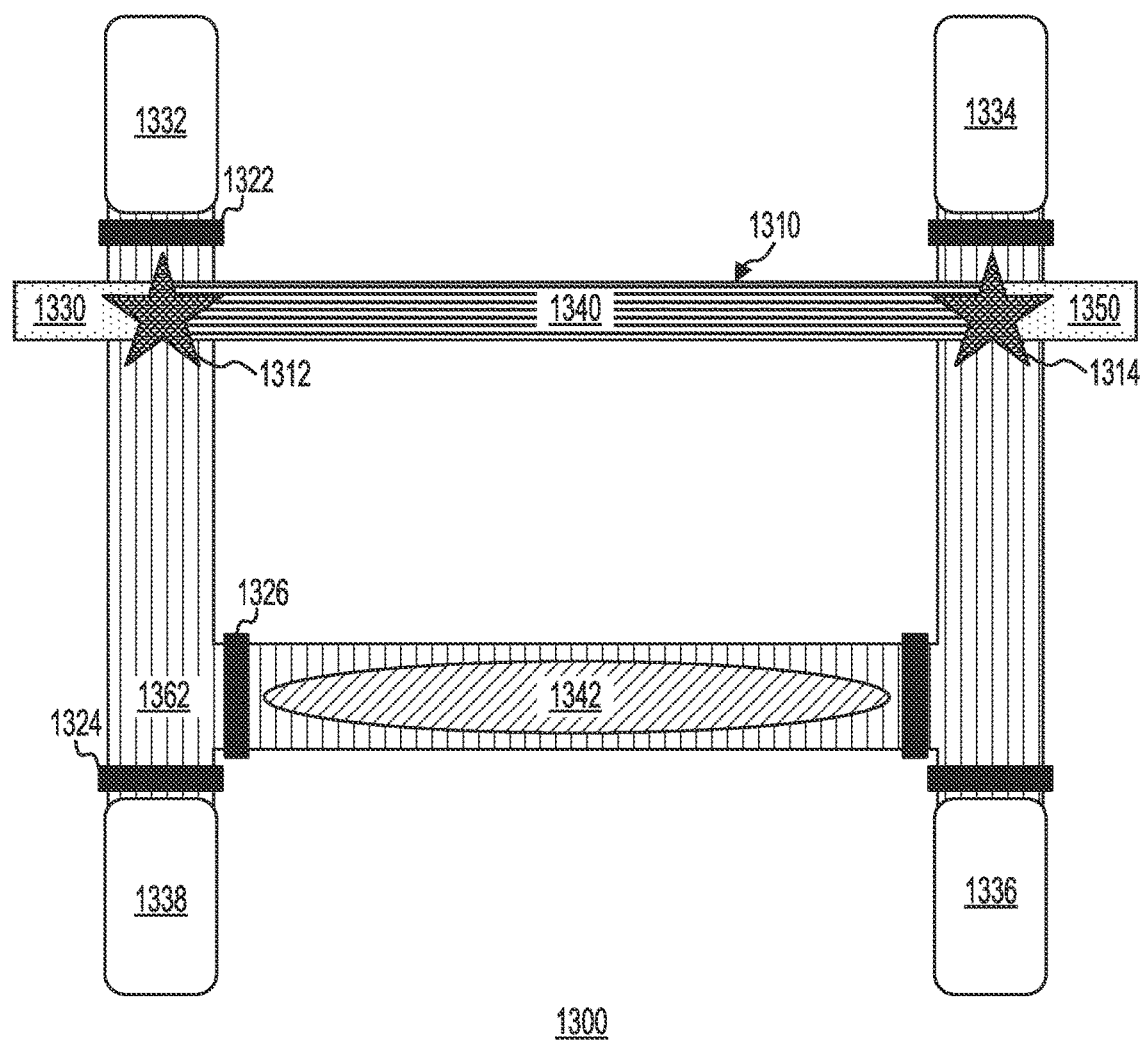
FIG. 13 shows a block diagram of another quantum device formed using a single superconducting wire in accordance with one example.
Figure 13:
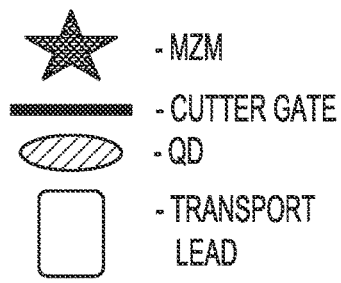

FIG. 13 shows a block diagram of a quantum device 1300 formed using a single superconducting wire in accordance with one example. Quantum device 1300 is another example linear Majorana parity device, whose topological sections can be tuned with the topological gap protocol. Quantum device 1300 may include a single superconducting wire 1310, whose sections can be configured into the topological phase or the trivial phase. As an example, superconducting wire sections 1330 and 1350 may be configured into a trivial phase. Superconducting wire section 1340 may be configured into a topological phase. In one example, as noted earlier, the terms topological and trivial refer to the phase of the superconductor sections that are tuned using electrostatic gates to form topological or trivial superconducting sections. Quantum device 1300 may be built by patterning a superconducting wire on a 2DEG, and then using a magnetic field along the axis of the wire and electrostatic gates to tune the wire sections into either a trivial or a topological phase. Single superconducting wire 1310 may be formed as a single nanowire. As an example, superconducting wire 1310 may be formed as a superconductor wire (e.g., indium arsenide (InAs)) coated by a superconductor (e.g., aluminum (Al)). Ends of superconducting wire section 1340 may further be coupled via semiconducting region 1362.

With continued reference to FIG. 13, quantum device 1300 is operated such that Majorana zero modes (MZMs) 1312 and 1314 are formed at the ends of superconducting wire section 1340. Electrostatic gates around the superconductor can be used to define an adjacent semiconducting region consisting of junctions, quantum dots, and transport leads, with all other parts of the 2DEG fully depleted. In this device, there are junctions between the MZMs and neighboring semiconductors (QDs or transport leads) and junctions between two semiconductors (QDs and transport leads). As an example, quantum device 1300 includes several electrostatic gates, including cutter gates 1322 and 1324. Quantum device 1300 further incudes several transport leads, including transport leads 1332, 1334, 1336, and 1338. Quantum device 1300 further includes a quantum dot 1342. Depending on the voltage applied to cutter gate 1322 the semiconducting region adjacent to transport lead 1332 may be tuned. In addition, cutter gate 1326 may be used to control the coupling to quantum dot 1342. In a similar manner, the junctions between the MZMs and neighboring semiconductors (QDs or transport leads) and the other junctions between two semiconductors (QDs and transport leads) can be tuned. Advantageously, building quantum device 1300 from a superconductor patterned on a 2DEG takes advantage of the high-quality 2DEG material, which is an essential component of realizing a topological phase and supporting the coherent single-electron transport required for MZM parity measurements. Moreover, building quantum device 1300 from a single superconducting wire simplifies fabrication. In addition, grounding the superconducting wire allows all topological wire segments to be tuned using the topological gap protocol. Furthermore, the modular nature of quantum device 1300 allows one to test its different components (topological superconductor, trivial superconductor, quantum dots, junctions) before operating the full quantum device. Finally, quantum device 1300 can be operated by tuning quantum dots on/off resonance.

Still referring to FIG. 13, MZMs supported by quantum device 1300 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 1300 can be grounded on each end (e.g., at the end of superconducting wire section 1330 and at the end of superconducting wire section 1350) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the MZM, one can supplement the topological gap protocol with transport measurements using spin filtering or particle-hole filtering for additional evidence of MZMs. Although FIG. 13 shows quantum device 1300 as including a certain number of components arranged and coupled in a certain way, quantum device 1300 may include fewer or additional components arranged and coupled differently.

The MZM junctions corresponding to quantum device 1300 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to tune the topological phase. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, II IV V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)).

Figure 14:
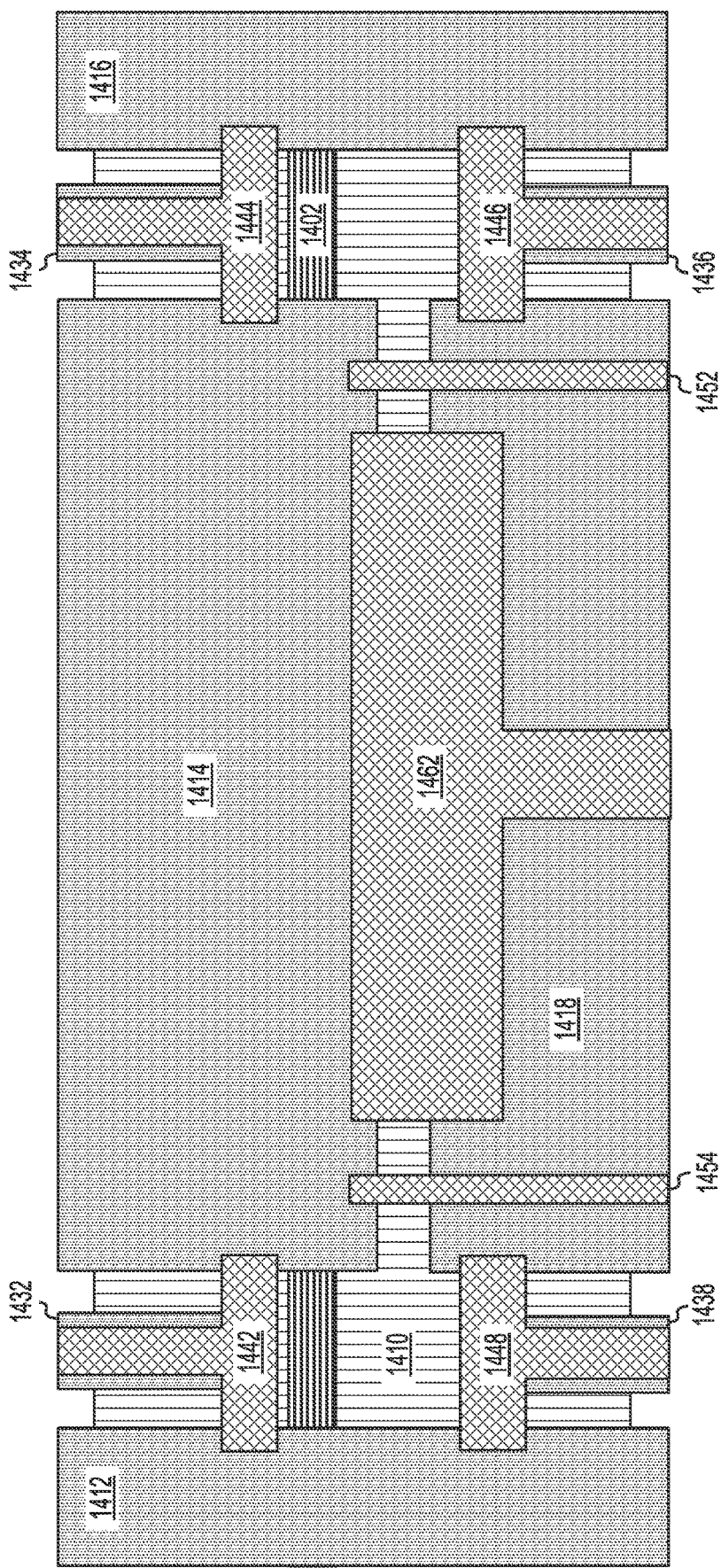
FIG. 14 shows a top view of an example dual layer gate configuration associated with the quantum device of FIG. 13.

FIG. 14 shows a top view 1400 of an example dual layer gate configuration associated with quantum device 1300 of FIG. 13. Single superconductor wire 1402 corresponds to single superconducting wire 1310, whose sections can be configured into the topological phase or the trivial phase. Single superconductor wire 1402 is formed on 2DEG 1410. Gates 1412 and 1416 are configurable as both depletion gates and trivial superconductor plunger gates. Gate 1414 is configurable as both a depletion gate and a topological superconductor plunger gate. Gate 1418 is configurable as a depletion gate. These gates may be formed in a first layer associated with quantum device 1300 of FIG. 13. In addition, transport leads, including transport leads 1432 (corresponding to transport lead 1332 of FIG. 13), 1434 (corresponding to transport lead 1334 of FIG. 11), 1436 (corresponding to transport lead 1336 of FIG. 13), and 1438 (corresponding to transport lead 1338 of FIG. 13) may also be formed in the first layer.

With continued reference to FIG. 14, additional gates, including cutter gates 1442, 1444, 1446, 1448, 1452, and 1454 may also be formed in a second layer, different from the first layer. OD plunger gate 1462 may also be formed in the second layer, different from the first layer. Applying appropriate voltages to these cutter gates and OD plunger gates allows one to tune the junctions between MZMs and neighboring semiconductors (QDs or transport leads) as well as the junctions between ODs and transport leads. As an example, QD plunger gate 1462 may be used to control the density of a quantum dot (e.g., quantum dot 1342 of FIG. 13). Although FIG. 14 shows a certain gate configuration corresponding to quantum device 1300 of FIG. 13, other gate configurations may also be used to implement the functionality of quantum device 1300 of FIG. 13. As an example, all gates may be implemented in a single layer.

Figure 15:
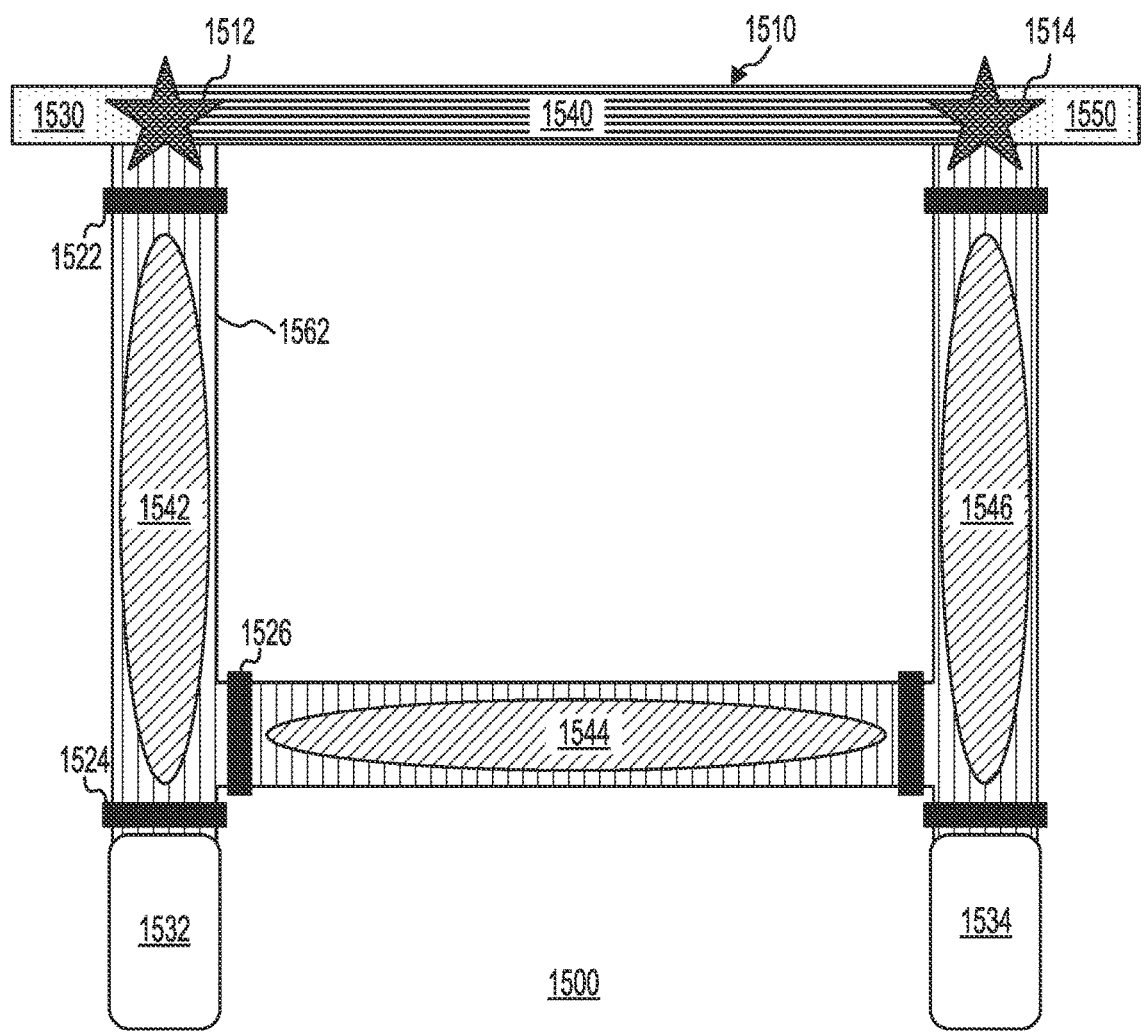
FIG. 15 shows a block diagram of another quantum device formed using a single superconducting wire in accordance with one example
Figure 15:
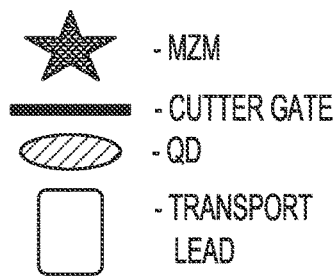

FIG. 15 shows a block diagram of a quantum device 1500 formed using a single superconducting wire in accordance with one example. Quantum device 1500 is another example linear Majorana parity device, whose topological sections can be tuned with transport. Quantum device 1500 may include a single superconducting wire 1510, whose sections can be configured into the topological phase or the trivial phase. As an example, superconducting wire sections 1530 and 1550 may be configured into the trivial phase. Superconducting wire section 1540 may be configured into the topological phase. In one example, as noted earlier, the terms topological and trivial refer to the phase of the superconductor sections that are tuned using electrostatic gates to form topological or trivial superconducting sections. Quantum device 1500 may be built by patterning a superconducting wire on a 2DEG, and then using a magnetic field along the axis of the wire and electrostatic gates to tune the wire sections into either a trivial or a topological phase. Single superconducting wire 1510 may be formed as a single nanowire. As an example, superconducting wire 1510 may be formed as a superconductor wire (e.g., indium arsenide (InAs)) coated by a superconductor (e.g., aluminum (Al)). Ends of superconducting wire section 1540 may further be coupled via semiconducting regions 1562, 1564 and 1566.

With continued reference to FIG. 15, quantum device 1500 is operated such that Majorana zero modes (MZMs) 1512 and 1514 are formed at the ends of superconducting wire section 1540. Electrostatic gates around the superconductor can be used to define an adjacent semiconducting region consisting of junctions, quantum dots, and transport leads, with all other parts of the 2DEG fully depleted. There may be three types of junctions in such devices: (1) junctions between the MZMs and neighboring semiconductors (QDs or transport leads), (2) junctions between QDs, and (3) junctions between QDs and transport leads. As an example, quantum device 1500 includes several electrostatic gates, including cutter gates 1522 and 1524. Quantum device 1500 further incudes transport leads 1532 and 1534. Quantum device 1500 further includes a quantum dot 1542, a second quantum dot 1544, and a third quantum dot 1546. Depending on the voltage applied to cutter gate 1524 the semiconducting region adjacent to transport lead 1532 may be tuned. In addition, QD plunger gate 1526 may be used to control the density of the region adjacent to quantum dot 1544. In a similar manner, an application of appropriate voltages to the cutter gates and QD plunger gates shown in FIG. 15, (1) junctions between the MZMs and neighboring semiconductors (QDs or transport leads), (2) junctions between QDs, and (3) junctions between QDs and transport leads can be tuned. Advantageously, building quantum device 1500 from a superconductor patterned on a 2DEG takes advantage of the high-quality 2DEG material, which is an essential component of realizing a topological phase and supporting the coherent single-electron transport required for MZM parity measurements. Moreover, building quantum device 1500 from a single superconducting wire simplifies fabrication. In addition, grounding the superconducting wire allows all topological wire segments to be tuned using the topological gap protocol. Furthermore, the modular nature of quantum device 1500 allows one to test its different components (topological superconductor, trivial superconductor, quantum dots, junctions) before operating the full quantum device. Finally, quantum device 1500 can be operated by tuning quantum dots on/off resonance.

Still referring to FIG. 15, MZMs supported by quantum device 1500 may be identified using the topological gap protocol. As part of this protocol, first local conductance measurements can be performed by running transport through an end of one of the topological wires to look for zero-bias peaks. When zero-bias peaks are detected at both ends of the topological wire, this is one form of evidence of having MZMs. Then, because the single superconducting wire associated with quantum device 1500 can be grounded on each end (e.g., at the end of superconducting wire section 1530 and at the end of superconducting wire section 1550) via an Ohmic contact to the ground, non-local transport can be run through each section of the superconducting wire to detect the transport gap. Observing the transport gap closing and reopening concurrent with the presence of simultaneous zero bias peaks on either end of the wire section signals the topological phase transition. Moreover, when there is a quantum dot between the transport lead and the MZM, one can supplement the topological gap protocol with transport measurements using spin filtering or particle-hole filtering for additional evidence of MZMs. Although FIG. 15 shows quantum device 1500 as including a certain number of components arranged and coupled in a certain way, quantum device 1500 may include fewer or additional components arranged and coupled differently.

The MZM junctions corresponding to quantum device 1500 described above may be implemented using various example gate configurations. Example gate configurations described herein relate to a layout for a two-dimensional electron gas (2DEG) qubit where the single superconducting wire is formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)).

Figure 16:
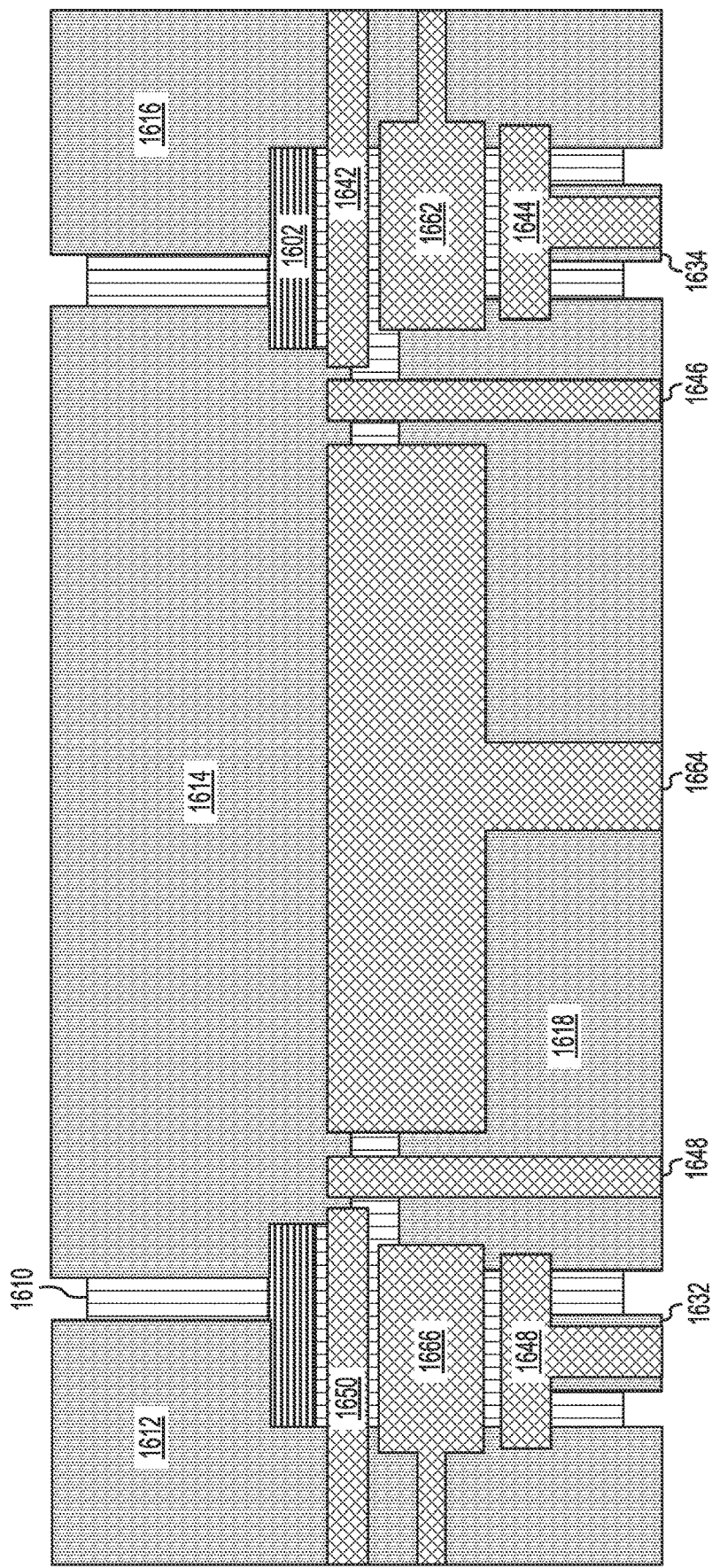
FIG. 16 shows a top view of an example dual layer gate configuration associated with the quantum device of FIG. 15.

FIG. 16 shows a top view 1600 of an example dual layer gate configuration associated with quantum device 1500 of FIG. 15. Single superconductor wire 1602 corresponds to single superconducting wire 1510, whose sections can be configured into the topological phase or the trivial phase. Single superconductor wire 1602 is formed on 2DEG 1610. Gates 1612 and 1616 are configurable as both depletion gates and trivial superconductor plunger gates. Gate 1614 is configurable as both a depletion gate and a topological superconductor plunger gate. Gate 1618 is configurable as a depletion gate. These gates may be formed in a first layer associated with quantum device 1500 of FIG. 15. In addition, transport leads, including transport lead 1632 (corresponding to transport lead 1582 of FIG. 15) and transport lead 1634 (corresponding to transport lead 1534 of FIG. 15) may also be formed in the first layer associated with quantum device 1500 of FIG. 15.

With continued reference to FIG. 16, additional gates, including cutter gates 1642, 1644, 1646, 1648, and 1650 may also be formed in a second layer, different from the first layer, QD plunger gates 1662, 1664, and 1666 may also be formed in the second layer, different from the first layer. As explained earlier, by an application of appropriate voltages to these cutter gates and QD plunger gates, the junctions, including: (1) junctions between the MZMs and neighboring semiconductors (QDs or transport leads), (2) junctions between QDs, and (3) junctions between QDs and transport leads can be tuned. As an example, QD plunger gate 1664 may be used to control the density of a quantum dot (e.g., quantum dot 1544 of FIG. 15). Although FIG. 16 shows a certain gate configuration corresponding to quantum device 1500 of FIG. 15, other gate configurations may also be used to implement the functionality of quantum device 1500 of FIG. 15. As an example, all gates may be implemented in a single layer.

Figure 17:
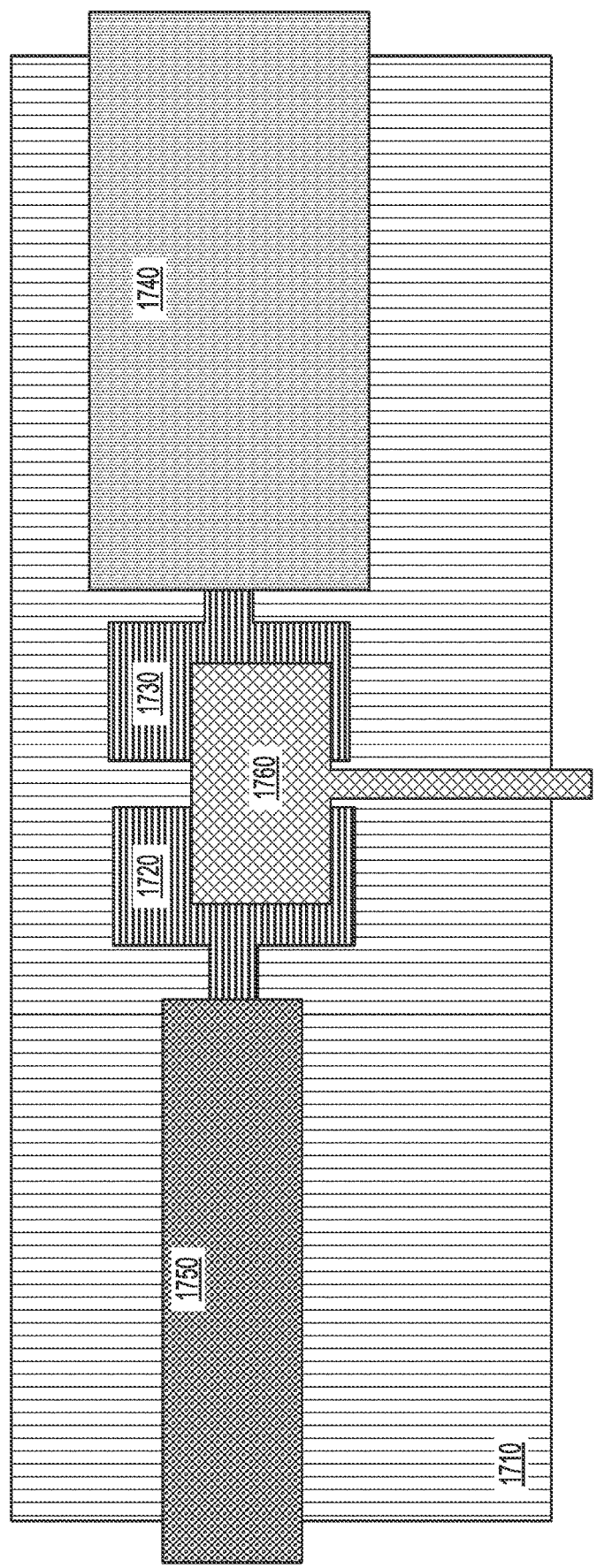
FIG. 17 shows a top view of an example implementation of a cuttable ground for use with the quantum devices of FIGS. 1-16.

FIG. 17 shows a top view 1700 of an example implementation of a cuttable ground for use with quantum devices described above with respect to FIGS. 1-16. In the quantum devices described above, the ends of the superconducting wire sections in the trivial phase can be coupled to an Ohmic contact such that these devices are grounded. At times, however, these quantum devices may need to be operated in a way that the ends of the superconducting wire sections in the trivial phase are not grounded. The cuttable ground described herein may be at only one end of the superconducting wire or at both ends of the superconducting wire. As shown in top view 1700, the cuttable ground is implemented by severing the single superconducting wire formed over the 2DEG 1710 into two discrete sections: superconducting wire section 1720 and superconducting wire section 1730. Superconducting wire section 1730 is configured to be in the trivial phase and is connected to another superconducting wire section in the topological phase (not shown), which would be located to the right of superconducting wire section 1730. View 1700 further shows a gate 1740 formed in a first layer of the quantum device for controlling the electron density of the 2DEG under superconducting wire section 1730 and for depleting the 2DEG around superconducting wire section 1730.

Superconducting wire section 1720 is coupled to an Ohmic contact 1750 for grounding the quantum device. Another gate 1760, formed in a second layer of the quantum device, different from the first layer of the quantum device, is used to control the connection between superconducting wire section 1720 and superconducting wire section 1730. When gate 1760 is accumulating, superconducting wire section 1720 is coupled with the superconducting wire section 1730 to ground the quantum device with the cuttable ground. On the other hand, when gate 1760 is depleting, the connection between superconducting wire section 1720 and superconducting wire section 1730 is severed, resulting in the quantum device floating, instead of being grounded.

In conclusion, the present disclosure relates to a quantum device configurable to be grounded. The quantum device comprises a single superconducting wire having at least a first section and a second section, each of which is configurable to be in a topological phase and at least a third section configurable to be in a trivial phase. The quantum device may further comprise semiconducting regions formed adjacent to the single superconducting wire, where the single superconducting wire is configurable to store quantum information in at least four Majorana zero modes (MZMs). The semiconducting regions formed adjacent to the single superconducting wire may be used to measure quantum information stored in the at least four MZMs.

The quantum information comprises a qubit. The quantum device may further include a plurality of transport leads, where each of the plurality of transport leads is couplable via a tunable junction to the single superconducting wire. The qubit may be tuned using transport signatures and then disconnected from a respective one or more of the plurality of transport leads. The qubit may be operated by measuring pairs of Majorana zero modes corresponding to different Pauli bases.

The single superconducting wire may be patterned on a two-dimensional electron gas (2DEG), and the quantum device may further comprise a plurality of electrostatic gates configurable to control the density of electrons in selected regions of the 2DEG. The quantum device may be formed using layers of materials, where a first subset of the plurality of electrostatic gates is formed in a first layer, and where a second subset of the plurality of electrostatic gates is formed in a second layer, different from the first layer. The quantum device may be configurable to be grounded via a cuttable ground contact.

In another example, the present disclosure relates to a quantum device configurable to be grounded. The quantum device comprises a single superconducting wire having at least a first section configurable to be in a topological phase and at least a second section configurable to be in a trivial phase. The quantum device may further comprise semiconducting regions formed adjacent to the single superconducting wire, where the single superconducting wire is configurable to store classical information in at least two Majorana zero modes (MZMs). The semiconducting regions formed adjacent to the single superconducting wire may be used to measure quantum information stored in the at least two MZMs.

The quantum device may further include a plurality of transport leads, where each of the plurality of transport leads is couplable via a tunable junction to the single superconducting wire. The quantum device may be tuned using transport signatures and then disconnected from a respective one or more of the plurality of transport leads. The quantum device may be operated by measuring the at least two MZMs by coupling the at least two MZMs to the semiconducting regions formed adjacent to the single superconducting wire.

The single superconducting wire may be patterned on a two-dimensional electron gas (2DEG), and the quantum device may further comprise a plurality of electrostatic gates configurable to control the density of electrons in selected regions of the 2DEG. The quantum device may be formed using layers of materials, where a first subset of the plurality of electrostatic gates is formed in a first layer, and where a second subset of the plurality of electrostatic gates is formed in a second layer, different from the first layer. The quantum device may be configurable to be grounded via a cuttable ground contact.

In yet another example, the present disclosure relates to a quantum device configurable to be grounded. The quantum device comprises a single superconducting wire having at least a first section and a second section, each of which is configurable to be in a topological phase and at least a third section configurable to be in a trivial phase. The quantum device may further comprise semiconducting regions formed adjacent to the single superconducting wire, where the single superconducting wire is configurable to store quantum information in at least four Majorana zero modes (MZMs). The semiconducting regions formed adjacent to the single superconducting wire may be used to measure quantum information stored in the at least four MZMs. The single superconducting wire may be patterned on a two-dimensional electron gas (2DEG), and the quantum device may further comprise a plurality of cutter gates and a plurality of quantum dot (QD) plunger gates.

The quantum information may comprise a qubit. The quantum device may comprise a plurality of transport leads, and each of the plurality of transport leads may be couplable via a tunable junction to the single superconducting wire. The qubit may be tuned using transport signatures and then disconnected from a respective one or more of the plurality of transport leads. The quantum device may be configurable to be grounded via a cuttable ground contact.

It is to be understood that the systems, devices, methods, and components described herein are merely examples. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a device, a system, or any other implementation of a functionality, is described herein as being coupled to another component does not mean that the components are necessarily separate components. As an example, a component A described as being coupled to another component B may be a sub-component of the component B, the component B may be a sub-component of the component A, or components A and B may be a combined sub-component of another component C.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A quantum device configurable comprising:
   a single superconducting wire, patterned on a two-dimensional electron gas (2DEG), having at least a first section and a second section, each of which is configurable to be in a topological phase, and at least a third section configurable to be in a trivial phase;
   a set of depletion gates, formed in a first layer of the quantum device, wherein each of the set of depletion gates is configured to remove electrons from selected areas of the 2DEG;
   a first set of cutter gates arranged on a first side of the first section of the single superconducting wire, formed in a second layer of the quantum device, different from the first layer of the quantum device, wherein the first set of cutter gates is configured to tune junctions on the first side of the first section of the single superconducting wire;
   a second set of cutter gates arranged on a second side, opposite to the first side of the first section of the single superconducting wire, formed in the second layer of the quantum device, wherein the second set of cutter gates is configured to tune junctions on the second side of the first section of the single superconducting wire;
   a third set of cutter gates arranged on a first side of the second section of the single superconducting wire, formed in the second layer of the quantum device, wherein the third set of cutter gates is configured to tune junctions on the first side of the second section of the single superconducting wire; and
   a fourth set of cutter gates arranged on a second side, opposite to the first side of the second section of the single superconducting wire, formed in the second layer of the quantum device, wherein the fourth set of cutter gates is configured to tune junctions on the second side of the second section of the single superconducting wire; and
   semiconducting regions, formed adjacent to the single superconducting wire, tuned by an application of voltage to one or more of the first set of cutter gates, the second set of cutter gates, the third set of cutter gates, and the fourth set of cutter gates in order to perform measurements associated with the quantum device.

2. The quantum device of claim 1, wherein the measurements associated with the quantum device comprise qubit measurements.

3. The quantum device of claim 2, further comprising a plurality of transport leads, wherein each of the plurality of transport leads is couplable via a tunable junction to the single superconducting wire.

4. The quantum device of claim 3, wherein the qubit is tuned using transport signatures and then disconnected from a respective one or more of the plurality of transport leads.

5. The quantum device of claim 4, wherein the quantum device is configurable to be grounded via a cuttable ground contact.

6. The quantum device of claim 1, further comprising a plurality of quantum dot (QD) plunger gates, wherein each of the plurality of QD plunger gates is used to control density of a corresponding quantum dot.

7. The quantum device of claim 1, wherein the semiconducting regions are configured to allow conductance measurements by running transport through an end of the single superconducting wire.

8. The quantum device of claim 1, wherein the semiconducting regions are configured to run non-local transport through each section of the single superconducting wire to detect opening or closing of any transport gap.

9. A quantum device comprising:
   a single superconducting wire, patterned on a two-dimensional electron gas (2DEG), having at least a first section and a second section, each of which is configurable to be in a topological phase, and at least a third section configurable to be in a trivial phase;
   a set of depletion gates, formed in a first layer of the quantum device, wherein each of the set of depletion gates is configured to remove electrons from selected areas of the 2DEG;
   a first set of cutter gates arranged on a first side of the first section of the single superconducting wire, formed in a second layer of the quantum device, different from the first layer of the quantum device, wherein the first set of cutter gates is configured to tune junctions on the first side of the first section of the single superconducting wire;
   a second set of cutter gates arranged on a second side, opposite to the first side of the first section of the single superconducting wire, formed in the second layer of the quantum device, wherein the second set of cutter gates is configured to tune junctions on the second side of the first section of the single superconducting wire;
   a third set of cutter gates arranged on a first side of the second section of the single superconducting wire, formed in the second layer of the quantum device, wherein the third set of cutter gates is configured to tune junctions on the first side of the second section of the single superconducting wire; and
   a fourth set of cutter gates arranged on a second side, opposite to the first side of the second section of the single superconducting wire formed in the second layer of the quantum device, wherein the fourth set of cutter gates is configured to tune junctions on the second side of the second section of the single superconducting wire; and semiconducting regions, formed adjacent to the single superconducting wire, tuned by an application of voltage to one or more of the first set of cutter gates, the second set of cutter gates, the third set of cutter gates, and the fourth set of cutter gates in order to run non-local transport through each section of the single superconducting wire to detect opening or closing of any transport gap.

10. The quantum device of claim 9, wherein the semiconducting regions are configured to allow qubit measurements associated with a qubit.

11. The quantum device of claim 10, wherein the quantum device comprises a plurality of transport leads, and wherein each of the plurality of transport leads is couplable via a tunable junction to the single superconducting wire.

12. The quantum device of claim 11, wherein the qubit is tuned using transport signatures and then disconnected from a respective one or more of the plurality of transport leads.

13. The quantum device of claim 9, wherein the quantum device is configurable to be grounded via a cuttable ground contact.

14. The quantum device of claim 9, further comprising a plurality of quantum dot (QD) plunger gates, wherein each of the plurality of QD plunger gates is used to control density of a corresponding quantum dot.

15. A topological superconductor device comprising:
a single superconducting wire, patterned on a two-dimensional electron gas (2DEG), having at least a first topological superconductor section and a second topological superconductor section, and at least a third trivial superconductor section;
a set of depletion gates, formed in a first layer of the quantum device, wherein each of the set of depletion gates is configured to remove electrons from selected areas of the 2DEG;
a first set of cutter gates arranged on a first side of the first topological superconductor section of the single superconducting wire, formed in a second layer of the quantum device, different from the first layer of the quantum device, wherein the first set of cutter gates is configured to tune junctions on the first side of the first topological superconductor section of the single superconducting wire;
a second set of cutter gates arranged on a second side, opposite to the first side of the first topological superconductor section of the single superconducting wire, formed in the second layer of the quantum device, wherein the second set of cutter gates is configured to tune junctions on the second side of the first topological superconductor section of the single superconducting wire;
a third set of cutter gates arranged on a first side of the second topological superconductor section of the single superconducting wire, formed in the second layer of the quantum device, wherein the third set of cutter gates is configured to tune junctions on the first side of the second topological superconductor section of the single superconducting wire; and
a fourth set of cutter gates arranged on a second side, opposite to the first side of the second topological superconductor section of the single superconducting wire, formed in the second layer of the quantum device, wherein the fourth set of cutter gates is configured to tune junctions on the second side of the second topological superconductor section of the single superconducting wire; and
semiconducting regions, formed adjacent to the single superconducting wire, tuned by an application of voltage to one or more of the first set of cutter gates, the second set of cutter gates, the third set of cutter gates, and the fourth set of cutter gates in order to allow local conductance measurements by running transport through an end of the single superconducting wire.

16. The topological superconductor device of claim 15, wherein the local conductance measurements comprise qubit measurements associated with a qubit.

17. The topological superconductor device of claim 15, wherein the topological superconductor device comprises a plurality of transport leads, and wherein each of the plurality of transport leads is couplable via a tunable junction to the single superconducting wire.

18. The topological superconductor device of claim 17, wherein the qubit is tuned using transport signatures and then disconnected from a respective one or more of the plurality of transport leads.

19. The topological superconductor device of claim 15, further comprising a plurality of quantum dot (QD) plunger gates, wherein each of the plurality of QD plunger gates is used to control density of a corresponding quantum dot.

20. The topological superconductor device of claim 15, wherein the semiconducting regions are configured to run non-local transport through each section of the superconducting wire to detect opening or closing of any transport gap.

* * * * *